(12) United States Patent
Seol et al.

(10) Patent No.: US 11,942,968 B2
(45) Date of Patent: Mar. 26, 2024

(54) TRANSMITTER AND RECEIVER FOR 3-LEVEL PULSE AMPLITUDE MODULATION SIGNALING AND SYSTEM INCLUDING THE SAME

(71) Applicant: Samsung Electronics Co., Ltd., Suwon-si (KR)

(72) Inventors: Changkyu Seol, Suwon-si (KR); Sungrae Kim, Suwon-si (KR); Chisung Oh, Suwon-si (KR); Junghwan Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/975,034

(22) Filed: Oct. 27, 2022

(65) Prior Publication Data

US 2023/0344444 A1 Oct. 26, 2023

(30) Foreign Application Priority Data

Apr. 25, 2022 (KR) .................. 10-2022-0050576
Jun. 10, 2022 (KR) .................. 10-2022-0070511
Jun. 29, 2022 (KR) .................. 10-2022-0079545

(51) Int. Cl.
*H03M 13/00* (2006.01)
*H03M 5/14* (2006.01)
*H04L 1/00* (2006.01)

(52) U.S. Cl.
CPC .......... *H03M 5/145* (2013.01); *H04L 1/0009* (2013.01); *H04L 1/0014* (2013.01)

(58) Field of Classification Search
None
See application file for complete search history.

(56) References Cited

U.S. PATENT DOCUMENTS 10,348,480 B2 * 7/2019 Hossain ............... H04L 7/0025
10,812,102 B2 10/2020 Cornelius et al.
(Continued)

FOREIGN PATENT DOCUMENTS

KR 102373807 B1 3/2022

OTHER PUBLICATIONS

European Search Report dated Sep. 13, 2023, issued in corresponding European Application No. 22203996.8.
(Continued)

*Primary Examiner* — Mujtaba M Chaudry
(74) *Attorney, Agent, or Firm* — Harness, Dickey & Pierce, P.L.C.

(57) ABSTRACT

A transmitter includes an encoder configured to divide a first number of binary input bits of an input data signal into a first bit group and a second bit group, generate a first intermediate bit group and a second intermediate bit group by manipulating the first bit group and the second bit group differently based on a value of the first bit group, and generate a first symbol group and a second symbol group by encoding the first intermediate bit group and the second intermediate bit group, each of the first symbol group and the second symbol group including a plurality of symbols, and each of the plurality of symbols having three different voltage levels. The transmitter includes a driver configured to generate an output data signal by concatenating the first symbol group and the second symbol group.

20 Claims, 25 Drawing Sheets

(56) References Cited

U.S. PATENT DOCUMENTS

| | | | |
|---|---|---|---|
| 10,897,382 B2 | 1/2021 | Kim et al. | |
| 11,025,364 B2 | 6/2021 | Shen et al. | |
| 11,038,726 B2 | 6/2021 | Greiss et al. | |
| 11,133,874 B2 | 9/2021 | Vera Villarroel et al. | |
| 11,146,430 B1 | 10/2021 | Lee et al. | |
| 11,545,980 B1* | 1/2023 | Lee | H04L 7/0334 |
| 2013/0195155 A1* | 8/2013 | Pan | H03D 1/00 |
| | | | 375/317 |
| 2015/0244394 A1 | 8/2015 | Wang et al. | |
| 2019/0081648 A1* | 3/2019 | Shimada | H04B 1/0475 |
| 2019/0303339 A1* | 10/2019 | Lee | H04L 1/0042 |
| 2020/0007362 A1 | 1/2020 | Kim et al. | |
| 2021/0058280 A1* | 2/2021 | Lee | H04L 25/0272 |
| 2021/0385060 A1* | 12/2021 | Van Ierssel | H04L 7/06 |

OTHER PUBLICATIONS

Hyunsu Park et al., ' 30-Gb/s 1.11-pi/bit Single-Ended PAM- 3 Transceiver for High- Speed Memory Links', IEEE Journal of Solid-State Circuits, IEEE, USA, vol. 56, No. 2, Jul. 15, 2020 (Jul. 15, 2020), pp. 581-590, XP011834675.

* cited by examiner

FIG. 4

$$S111 \quad S113$$
BTG1(b0,b1,b2,b3,b4) ⇒ IBTG11 ⇒ IBTG1(Ib0,Ib1,Ib2,Ib3,Ib4)

$$S112$$
BTG2(b5,b6,b7,b8,b9,b10) ⇒ IBTG12(CHK,BTG2)=(0,b5,b6,b7,b8,b9,b10)
⇒ IBTG2(Ib5,Ib6,Ib7,Ib8,Ib9,Ib10,Ib11)
$$S114$$

FIG. 5

$$S211$$
BTG1(b0,b1,b2,b3,b4) ⇒ IBTG21(b2^b3,b3',b4,b5,b6)
⇒ IBTG1(Ib0,Ib1,Ib2,Ib3,Ib4)
$$S213$$

$$S212$$
BTG2(b5,b6,b7,b8,b9,b10) ⇒ IBTG22(CHK,0,0,b7,b8,b9,b10)
⇒ IBTG2(Ib5,Ib6,Ib7,Ib8,Ib9,Ib10,Ib11)
$$S214$$

FIG. 8

LUT1

| INPUT BITS ib[0:4] | S1 t[0:1] | S2 t[2:3] | S3 t[4:5] | CHK |
|---|---|---|---|---|
| 00000 | 3 | 1 | 0 | 0 |
| 00001 | 3 | 1 | 1 | 0 |
| 00010 | 3 | 3 | 0 | 0 |
| 00011 | 3 | 3 | 1 | 0 |
| 00100 | 3 | 0 | 1 | 0 |
| 00101 | 3 | 1 | 3 | 0 |
| 00110 | 3 | 0 | 3 | 0 |
| 00111 | 3 | 3 | 3 | 0 |
| 01000 | 1 | 1 | 0 | 0 |
| 01001 | 1 | 3 | 1 | 0 |
| 01010 | 1 | 3 | 0 | 0 |
| 01011 | 1 | 1 | 1 | 0 |
| 01100 | 1 | 0 | 1 | 0 |
| 01101 | 1 | 1 | 3 | 0 |
| 01110 | 1 | 0 | 3 | 0 |
| 01111 | 1 | 3 | 3 | 0 |
| 10000 | 0 | 1 | 0 | 0 |
| 10001 | 0 | 1 | 1 | 0 |
| 10010 | 0 | 3 | 0 | 0 |
| 10011 | 0 | 3 | 1 | 0 |
| 10100 | 0 | 0 | 1 | 0 |
| 10101 | 0 | 1 | 3 | 0 |
| 10110 | 0 | 0 | 3 | 0 |
| 10111 | 0 | 3 | 3 | 0 |
| 11000 | 1 | 0 | 0 | 0 |
| 11001 | 3 | 0 | 0 | 0 |
| 11010 | X | X | X | 1 |
| 11011 | X | X | X | 1 |
| 11100 | X | X | X | 1 |
| 11101 | X | X | X | 1 |
| 11110 | X | X | X | 1 |
| 11111 | X | X | X | 1 |

UNASSIGNED (rows 11010–11111)

FIG. 9

| CHK | $|b0 \times |b1 \times |b3 + |b0 \times |b1 \times |b2$ |
|---|---|
| t0 | $|b0' + |b1$ |
| t1 | $|b0 \times |b1 \times |b4 + |b0' \times |b1'$ |
| t2 | $|b0' \times |b2' + |b1' \times |b2' + |b2 \times |b4$ |
| t3 | $|b2' \times |b3 + |b3 \times |b4$ |
| t4 | $|b0' \times |b4 + |b1' \times |b4 + |b2$ |
| t5 | $|b2 \times |b4 + |b2 \times |b3$ |

FIG. 10A

LUT2

| tb[5:11] | S3 t[6:7] | S4 t[8:9] | S5 t[10:11] | S6 t[12:13] |
|---|---|---|---|---|
| 0000000 | 1 | 0 | 1 | 0 |
| 0000001 | 1 | 0 | 1 | 1 |
| 0000010 | 1 | 0 | 3 | 0 |
| 0000011 | 1 | 0 | 3 | 1 |
| 0000100 | 1 | 0 | 0 | 3 |
| 0000101 | 1 | 0 | 1 | 3 |
| 0000110 | 1 | 0 | 0 | 0 |
| 0000111 | 1 | 0 | 3 | 1 |
| 0001000 | 1 | 1 | 1 | 0 |
| 0001001 | 1 | 1 | 1 | 1 |
| 0001010 | 1 | 1 | 3 | 0 |
| 0001011 | 1 | 1 | 3 | 1 |
| 0001100 | 1 | 1 | 0 | 3 |
| 0001101 | 1 | 1 | 1 | 3 |
| 0001110 | 1 | 1 | 0 | 3 |
| 0001111 | 1 | 1 | 3 | 3 |

| tb[5:11] | S3 t[6:7] | S4 t[8:9] | S5 t[10:11] | S6 t[12:13] |
|---|---|---|---|---|
| 0010000 | 3 | 0 | 1 | 0 |
| 0010001 | 3 | 0 | 1 | 1 |
| 0010010 | 3 | 0 | 3 | 0 |
| 0010011 | 3 | 0 | 3 | 1 |
| 0010100 | 3 | 0 | 0 | 1 |
| 0010101 | 3 | 0 | 1 | 3 |
| 0010110 | 3 | 0 | 0 | 3 |
| 0010111 | 3 | 0 | 3 | 3 |
| 0011000 | 3 | 1 | 1 | 0 |
| 0011001 | 3 | 1 | 1 | 1 |
| 0011010 | 3 | 1 | 3 | 0 |
| 0011011 | 3 | 1 | 3 | 1 |
| 0011100 | 3 | 1 | 0 | 1 |
| 0011101 | 3 | 1 | 1 | 3 |
| 0011110 | 3 | 1 | 0 | 3 |
| 0011111 | 3 | 1 | 3 | 3 |

FIG. 10B

LUT2

| lb[5:11] | S3 t[6:7] | S4 t[8:9] | S5 t[10:11] | S6 t[12:13] |
|---|---|---|---|---|
| 0100000 | 0 | 1 | 1 | 0 |
| 0100001 | 0 | 1 | 1 | 1 |
| 0100010 | 0 | 1 | 3 | 0 |
| 0100011 | 0 | 1 | 3 | 1 |
| 0100100 | 0 | 1 | 0 | 1 |
| 0100101 | 0 | 1 | 1 | 3 |
| 0100110 | 0 | 1 | 0 | 3 |
| 0100111 | 0 | 1 | 3 | 0 |
| 0101000 | 1 | 3 | 1 | 1 |
| 0101001 | 1 | 3 | 1 | 0 |
| 0101010 | 1 | 3 | 3 | 1 |
| 0101011 | 1 | 3 | 3 | 0 |
| 0101100 | 1 | 3 | 0 | 1 |
| 0101101 | 1 | 3 | 1 | 3 |
| 0101110 | 1 | 3 | 0 | 3 |
| 0101111 | 1 | 3 | 3 | 3 |

| lb[5:11] | S3 t[6:7] | S4 t[8:9] | S5 t[10:11] | S6 t[12:13] |
|---|---|---|---|---|
| 0110000 | 0 | 3 | 1 | 0 |
| 0110001 | 0 | 3 | 1 | 1 |
| 0110010 | 0 | 3 | 3 | 0 |
| 0110011 | 0 | 3 | 3 | 1 |
| 0110100 | 0 | 3 | 0 | 1 |
| 0110101 | 0 | 3 | 1 | 3 |
| 0110110 | 0 | 3 | 0 | 3 |
| 0110111 | 0 | 3 | 3 | 3 |
| 0111000 | 3 | 3 | 1 | 0 |
| 0111001 | 3 | 3 | 1 | 1 |
| 0111010 | 3 | 3 | 3 | 0 |
| 0111011 | 3 | 3 | 3 | 1 |
| 0111100 | 3 | 3 | 0 | 1 |
| 0111101 | 3 | 3 | 1 | 3 |
| 0111110 | 3 | 3 | 0 | 3 |
| 0111111 | 3 | 3 | 3 | 3 |

FIG. 10C

LUT2

| lb[5:11] | S3 t[6:7] | S4 t[8:9] | S5 t[10:11] | S6 t[12:13] |
|---|---|---|---|---|
| 1000000 | 0 | 0 | 1 | 0 |
| 1000001 | 0 | 0 | 1 | 1 |
| 1000010 | 0 | 0 | 3 | 0 |
| 1000011 | 0 | 0 | 3 | 1 |
| 1000100 | 0 | 0 | 0 | 1 |
| 1000101 | 0 | 0 | 1 | 3 |
| 1000110 | 0 | 0 | 0 | 3 |
| 1000111 | 0 | 0 | 3 | 3 |
| 1001000 | 1 | 1 | 0 | 0 |
| 1001001 | 1 | 0 | 0 | 0 |
| 1001010 | 3 | 1 | 0 | 0 |
| 1001011 | 3 | 1 | 0 | 0 |
| 1001100 | 0 | 1 | 0 | 0 |
| 1001101 | 1 | 3 | 0 | 0 |
| 1001110 | 0 | 3 | 0 | 0 |
| 1001111 | 3 | 3 | 0 | 0 |

| lb[5:11] | S3 t[6:7] | S4 t[8:9] | S5 t[10:11] | S6 t[12:13] |
|---|---|---|---|---|
| 1010000 | x | x | x | x |
| 1010001 | x | x | x | x |
| 1010010 | x | x | x | x |
| 1010011 | x | x | x | x |
| 1010100 | x | x | x | x |
| 1010101 | x | x | x | x |
| 1010110 | x | x | x | x |
| 1010111 | x | x | x | x |
| 1011000 | x | x | x | x |
| 1011001 | x | x | x | x |
| 1011010 | x | x | x | x |
| 1011011 | x | x | x | x |
| 1011100 | x | x | x | x |
| 1011101 | x | x | x | x |
| ... | ... | ... | ... | ... |
| 1111111 | x | x | x | x |

UNASSIGNED

FIG. 11

| t6  | Ib5'xIb6'+Ib8xIb9'+Ib8xIb11+Ib6xIb8 |
|-----|---|
| t7  | Ib5xIb8xIb9'xIb10+Ib5xIb8xIb10xIb11+Ib6'xIb7+Ib7xIb8 |
| t8  | Ib5'xIb8+Ib8xIb11+Ib8xIb9+Ib6 |
| t9  | Ib5xIb8xIb9xIb11+ Ib5xIb8xIb9xIb10+Ib6xIb8+ Ib6xIb7 |
| t10 | Ib5'xIb9'+ Ib8'xIb9'+ Ib5'xIb11+ Ib8'xIb11 |
| t11 | Ib5'xIb9'xIb10+ Ib8'xIb9'xIb10+ Ib5'xIb10xIb11+ Ib8'xIb10xIb11 |
| t12 | Ib5'xIb11+Ib8'xIb11+Ib5'xIb9+Ib8'xIb9 |
| t13 | Ib5'xIb9xIb11+ Ib8'xIb9xIb11+Ib5'xIb9xIb10+ Ib8'xIb9xIb10 |

FIG. 16

| lb0 | $t2'xt4'+t0'$ |
|---|---|
| lb1 | $t0xt1'+ t2xt4'$ |
| lb2 | $t2'xt4'+t5$ |
| lb3 | $t2'xt5+t3$ |
| lb4 | $t1xt2'xt4'+t2xt4$ |

FIG. 17

| lb5 | $t6'xt8'+t10'xt12'$ |
|---|---|
| lb6 | $t6'xt8xt10+ t6'xt8xt12+t9xt10+t9xt12$ |
| lb7 | $t6'xt9xt10+ t6'xt9xt12+t7xt10+t7xt12$ |
| lb8 | $t6xt8+t10xt12$ |
| lb9 | $t10'xt12+ t6'xt10'+t9xt10'+t9xt13$ |
| lb10 | $t6'xt9xt10'xt12'+ t7xt10'xt12'+t10'xt13xt11$ |
| lb11 | $t6xt8xt10'xt12'+ t10xt12$ |

TRANSMITTER AND RECEIVER FOR 3-LEVEL PULSE AMPLITUDE MODULATION SIGNALING AND SYSTEM INCLUDING THE SAME

CROSS-REFERENCE TO RELATED APPLICATIONS

This application claims priority under 35 USC § 119 to Korean Patent Application No. 10-2022-0050576, filed on Apr. 25, 2022, to Korean Patent Application No. 10-2022-0070511, filed on Jun. 10, 2022, and to Korean Patent Application No. 10-2022-0079545, filed on Jun. 29, 2022, in the Korean Intellectual Property Office (KIPO), the disclosures of each of which are incorporated herein by reference in their entirety.

FIELD

Some example embodiments relate generally to semiconductor integrated circuits, including a transmitter and receiver for 3-level pulse amplitude modulation signaling and/or a system including the same.

BACKGROUND

Recently, there is an intensive desire or requirement of memory bandwidth for high performance computing (HPC), such as an artificial intelligence (AI) and a graphic processing unit (GPU). The enlargement of the bandwidth may rely on the innovation of the process technology. Development in the process technology has been creating higher density in integrated circuits (ICs).

For increasing the bandwidth, pulse amplitude modulation-2 (PAM-2) signaling having two data modulation levels may be used for data communication. The conventional PAM-2 signaling may make it possible to simplify the structure of a transceiver. However, only one bit may be transmitted during one unit interval (UI), and the clock frequency desires or needs to increase to increase bandwidth. For this reason, this may cause channel attenuation and deterioration of clock quality.

Pulse amplitude modulation-4 (PAM-4) signaling may transmit two bits during one UI. However, in terms of single-ended signaling, the sensing margin of the PAM-4 signaling is very small, and the PAM-4 signaling is very sensitive to the supply voltage noise and the linearity of a signal is very low. Accordingly, the feasibility of the PAM-4 signaling may be low.

Pulse amplitude modulation-3 (PAM-3) signaling refers to signaling that transmits three voltage levels at a time, and may theoretically transmit 1.5849 bits (log 2 $3 \leqslant 1.5849$). However, the PAM-3 signaling has structural inefficiency. The PAM-3 interface may not encode two bits in one UI, and it is difficult for an output driver to maintain impedance matching for all inputs.

SUMMARY

Some example embodiments provide a transmitter capable of reducing occupied area and power consumption while using PAM-3 signaling.

Some example embodiments provide a receiver capable of reducing occupied area and power consumption while using PAM-3 signaling.

Some example embodiments provide a system including a transmitter and a receiver that are capable of reducing occupied area and power consumption while using PAM-3 signaling.

According to some example embodiments, a transmitter includes an encoder configured to divide a first number of binary input bits of an input data signal into a first bit group and a second bit group, generate a first intermediate bit group and a second intermediate bit group by manipulating the first bit group and the second bit group differently based on a value of the first bit group, and generate a first symbol group by encoding the first intermediate bit group and generate a second symbol group by encoding the second intermediate bit group, each of the first symbol group and the second symbol group including a plurality of symbols, and each of the plurality of symbols having three different voltage levels. The transmitter includes a driver configured to generate an output data signal by concatenating the first symbol group and the second symbol group, the driver configured to transmit the output data signal through a channel.

According to some example embodiments, a receiver includes a decoder configured to generate a first intermediate bit group by decoding a first symbol group of an input data signal, and generate a second intermediate bit group by decoding a second symbol group of the input data signal, each of the first symbol group and the second symbol group including a plurality of symbols, and each of the plurality of symbols having three different voltage levels, and generate a first bit group and a second bit group by manipulating the first intermediate bit group and the second intermediate bit group differently based on a value of a specific bit of the second intermediate bit group. The receiver includes a buffer configured to generate an output data signal including a first number of binary output bits by buffering the first bit group and the second bit group.

According to some example embodiments, a system includes a transmitter including an encoder and a driver, the transmitter configured to output a write data to be stored in a semiconductor memory device, a channel configured to transmit the write data, and a receiver including a decoder and a buffer, the receiver configured to receive the write data. The encoder is configured to divide a first number of binary input bits of an input data signal into a first bit group and a second bit group, generate a first intermediate bit group and a second intermediate bit group by manipulating the first bit group and the second bit group differently based on a value of the first bit group, and generate a first symbol group by encoding the first intermediate bit group and generate a second symbol group by encoding the second intermediate bit group, each of the first symbol group and the second symbol group including a plurality of symbols, and each of the plurality of symbols having three different voltage levels. The driver is configured to generate an output data signal by concatenating the first symbol group and the second symbol group and configured to transmit the output data signal through the channel the decoder is configured to receive the output data signal including the first symbol group and the second symbol group, generate the first intermediate bit group by decoding the first symbol group and generate the second intermediate bit group by decoding the second symbol group, and generate the first bit group and the second bit group by manipulating the first intermediate bit group and the second intermediate bit group differently based on a value of a specific bit of the second intermediate bit group. The buffer is configured to generate an output data signal including the first number of binary output bits by buffering the first bit group and the second bit group.

Accordingly, the transmitter according to an example embodiments, instead of encoding the first number of binary input bits into symbols at one time, divides the first number of binary input into the first bit group including a second number of binary input bits and the second bit group including a third number of binary input bits, generates the first intermediate bit group and the second intermediate bit group by manipulating the first bit group and the second bit group differently according to the value of the first bit group and generates the first symbol group and the second symbol group by encoding the first intermediate bit group and the second intermediate bit group in parallel. Accordingly, the transmitter may reduce an occupied area and power consumption.

BRIEF DESCRIPTION OF THE DRAWINGS

Illustrative, non-limiting example embodiments will be more clearly understood from the following detailed description taken in conjunction with the accompanying drawings.

FIG. 4 illustrates an operation of the first data manipulator in the intermediate data generator of FIG. 3 according to some example embodiments.

FIG. 5 illustrates an operation of the second data manipulator in the intermediate data generator of FIG. 3 according to some example embodiments.

FIG. 8 illustrates an example of a first look-up table that the first sub encoder in FIG. 7 uses according to some example embodiments.

FIG. 9 is an example table that implements the first look-up table of FIG. 8 with gate-level logic.

FIGS. 10A, 10B and 10C illustrate an example of a second look-up table that the second sub encoder in FIG. 7 uses according to some example embodiments.

FIG. 11 is an example table that implements the second look-up table of FIGS. 10A, 10B and 10C with gate-level logic.

FIG. 16 illustrates an example table that represents relationship between bits of the first symbols and the first intermediate bits in the receiver of FIG. 12 according to some example embodiments.

FIG. 17 illustrates an example table that represents relationship between bits of the second symbols and the second intermediate bits in the receiver of FIG. 12 according to some example embodiments.

DETAILED DESCRIPTION

Figure 1:
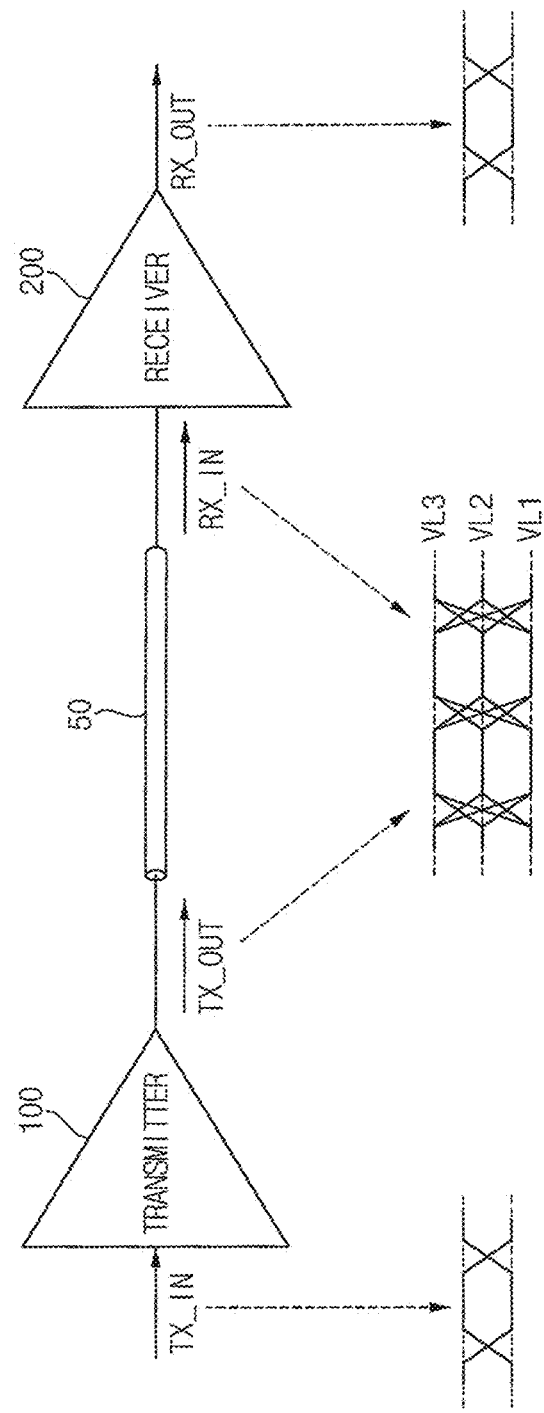
FIG. 1 is a block diagram illustrating a transmitter and a receiver according to some example embodiments.

Various example embodiments will be described more fully with reference to the accompanying drawings, in which some example embodiments are shown. The inventive concepts may, however, be embodied in many different forms and should not be construed as limited to the example embodiments set forth herein. Like reference numerals refer to like elements throughout this application.

A multi-level signaling scheme may be used as a means of compressing the bandwidth required to transmit data at a given bit rate. In a simple binary scheme, two single symbols, usually two voltage levels, may be used to represent '1' and '0,' and thus the symbol rate may be equal to the bit rate. In contrast, the principle of the multi-level signaling scheme may be to use a larger alphabet of m symbols to represent data, so that each symbol may represent more than one bit of data. As a result, the number of symbols that needs to be transmitted may be less than the number of bits (e.g., the symbol rate may be less than the bit rate), and thus the bandwidth may be compressed.

In other words, the multi-level signaling scheme may be used to increase a data transmission (or transfer) rate without increasing the frequency of data transmission and/or a transmission power of the communicated data. An example of one type of the multi-level signaling scheme may be a pulse amplitude modulation (PAM) scheme, where a unique symbol of a multi-level signaling may represent a plurality of bits of data.

FIG. 1 is a block diagram illustrating a transmitter and a receiver according to some example embodiments.

Referring to FIG. 1, a transmitter (TX) 100 and a receiver (RX) 200 may be connected to each other through a channel 50.

The transmitter 100 may generate an output data signal TX_OUT based on an input data signal TX_IN including a plurality of binary input bits. The output data signal TX_OUT may include a plurality of PAM-3 symbols and each of the plurality of PAM-3 symbols may have a first voltage level VL1, a second voltage level VL2 and a third voltage level VL3. The output data signal TX_OUT may be transmitted to the receiver 200 through the channel 50. The receiver 200 may generate an output data signal RX_OUT including a plurality of binary output bits based on an input data signal RX_IN including a plurality of PAM-3 symbols.

For example, the three voltage levels of the output data signal TX_OUT may include a first voltage level VL1, a second voltage level VL2 higher than the first voltage level VL1, and a third voltage level VL3 higher than the second voltage level VL2. The first voltage level VL1, the second voltage level VL2 and the third voltage level VL3 may be referred to as a low level, a middle (or mid) level and a high level, respectively.

For example, the output data signal RX_OUT may have two voltage levels that are different from each other, and one value (or data) included in the output data signal RX_OUT that is the binary signal may represent one value (or bit) included in the input data signal TX_IN.

For example, the two voltage levels of the output data signal RX_OUT may include the first voltage level VL1 and a fourth voltage level VL4 higher than the first voltage level VL1. The first voltage level VL1 and the fourth voltage level VL4 may be referred to as a low level and a high level, respectively. For example, the fourth voltage level VL4 may be higher than the third voltage level VL3, and may be about 1.2V. In other words, a swing width (e.g., a voltage difference between the low and high levels) of the output data signal RX_OUT may be greater than a swing width of the output data signal TX_OUT.

For example, the input data signal TX_IN that is the binary signal may also have two voltage levels that are different from each other. For example, although not illustrated in FIG. 1, a low level of the input data signal TX_IN may be substantially equal to the first voltage level VL1, and a high level of the input data signal TX_IN may be substantially equal to the third voltage level VL3.

The transmitter 100 and the receiver 200 according to some example embodiments may have a structure for reducing occupied area and power consumption. Detailed configurations and operations of the transmitter 100 will be described with reference to FIGS. 2 through 12. Detailed configurations and operations of the receiver 200 will be described with reference to FIGS. 13 through 17.

Figure 2:
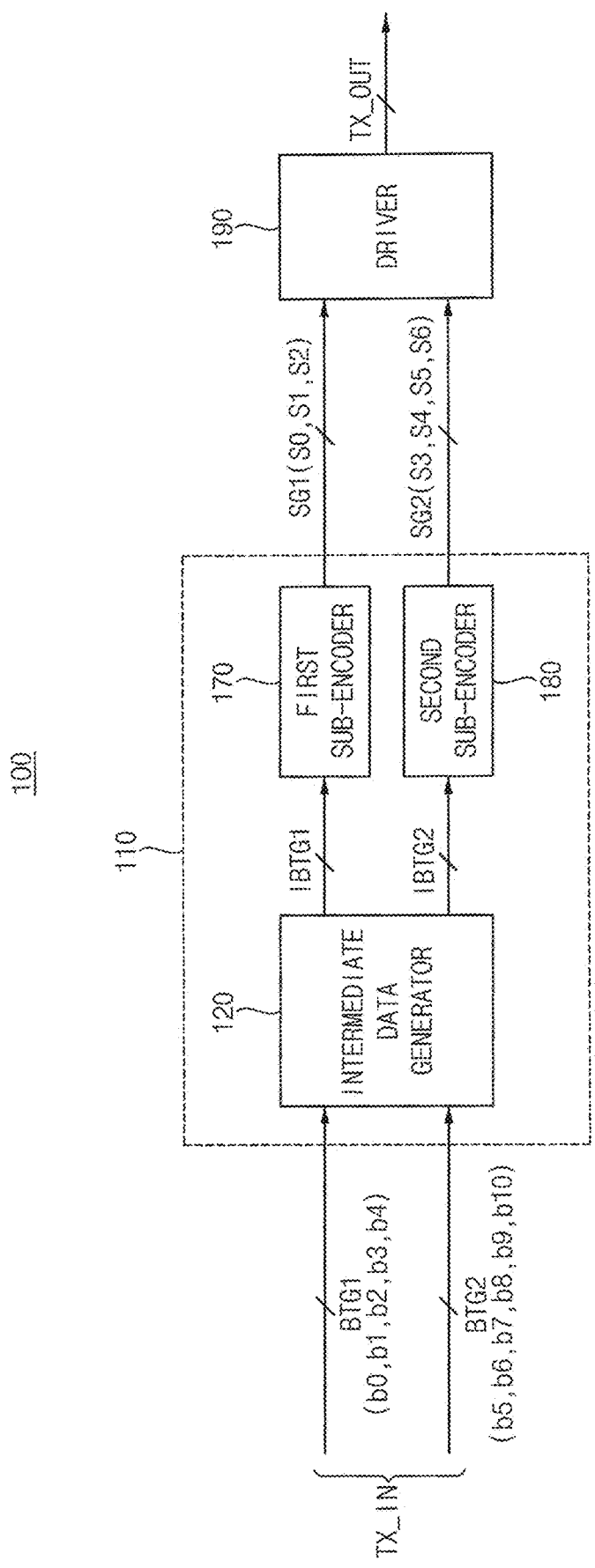
FIG. 2 is a block diagram illustrating an example of the transmitter in FIG. 1 according to some example embodiments.

FIG. 2 is a block diagram illustrating an example of the transmitter in FIG. 1 according to some example embodiments.

Referring to FIG. 2, the transmitter 100 may include an encoder 110 and a driver 190.

The encoder 110 may divide a first number of binary input bits of the input data signal TX_IN into a first bit group BTG1 and a second bit group BTG2, may generate a first intermediate bit group IBTG1 and a second intermediate bit group IBTG2 by manipulating the first bit group BTG1 and the second bit group BTG2 differently and may generate a first symbol group SG1 and a second symbol group SG1 by encoding the first intermediate bit group IBTG1 and the second intermediate bit group IBTG2, respectively. Each of the first symbol group SG1 and the second symbol group SG2 may include a plurality of symbols and each of the plurality of symbols may have three different voltage levels.

The driver 190 may generate the output data signal TX_OUT by concatenating the first symbol group SG1 and the second symbol group SG2 and may transmit the output data signal TX_OUT to the receiver 200 through the channel 50.

For example, when the input data signal TX_IN includes a first number of binary input bits b0, b1, b2, b3, b4, b5, b6, b7, b8, b9 and b10, the first bit group BTG1 may include a second number of binary input bits b0, b1, b2, b3 and b4, the second bit group BTG2 may include a third number of binary input bits b5, b6, b7, b8, b9 and b10 and the third number may be greater than the second number.

The first number may correspond to eleven, the second number may correspond to five and the third number may correspond to six.

In addition, the first symbol group SG1 may include a plurality of first symbols S0, S1 and S2 and the second symbol group SG2 may include a plurality of second symbols S3, S4, S5 and S6. That is, the first symbol group SG1 may include a fifth number of first symbols S0, 51 and S2 and the second symbol group SG2 may include a sixth number second symbols S3, S4, S5 and S6.

The encoder 110 may include an intermediate data generator 120, a first sub encoder 170 and a second sub encoder 180.

The intermediate data generator 120 may generate the first intermediate bit group IBTG1 and the second intermediate bit group IBTG2 by manipulating the first bit group BTG1 including binary input bits b0, b1, b2, b3 and b4 and the and the second bit group BTG2 including the binary input bits b5, b6, b7, b8, b9 and b10.

The first sub encoder 170 may generate the first symbol group SG1 including the first symbols S0, S1 and S2 by encoding the first intermediate bit group IBTG1. The second sub encoder 180 may generate the second symbol group SG2 including the second symbols S3, S4, S5 and S6 by encoding the second intermediate bit group IBTG2.

Figure 3:
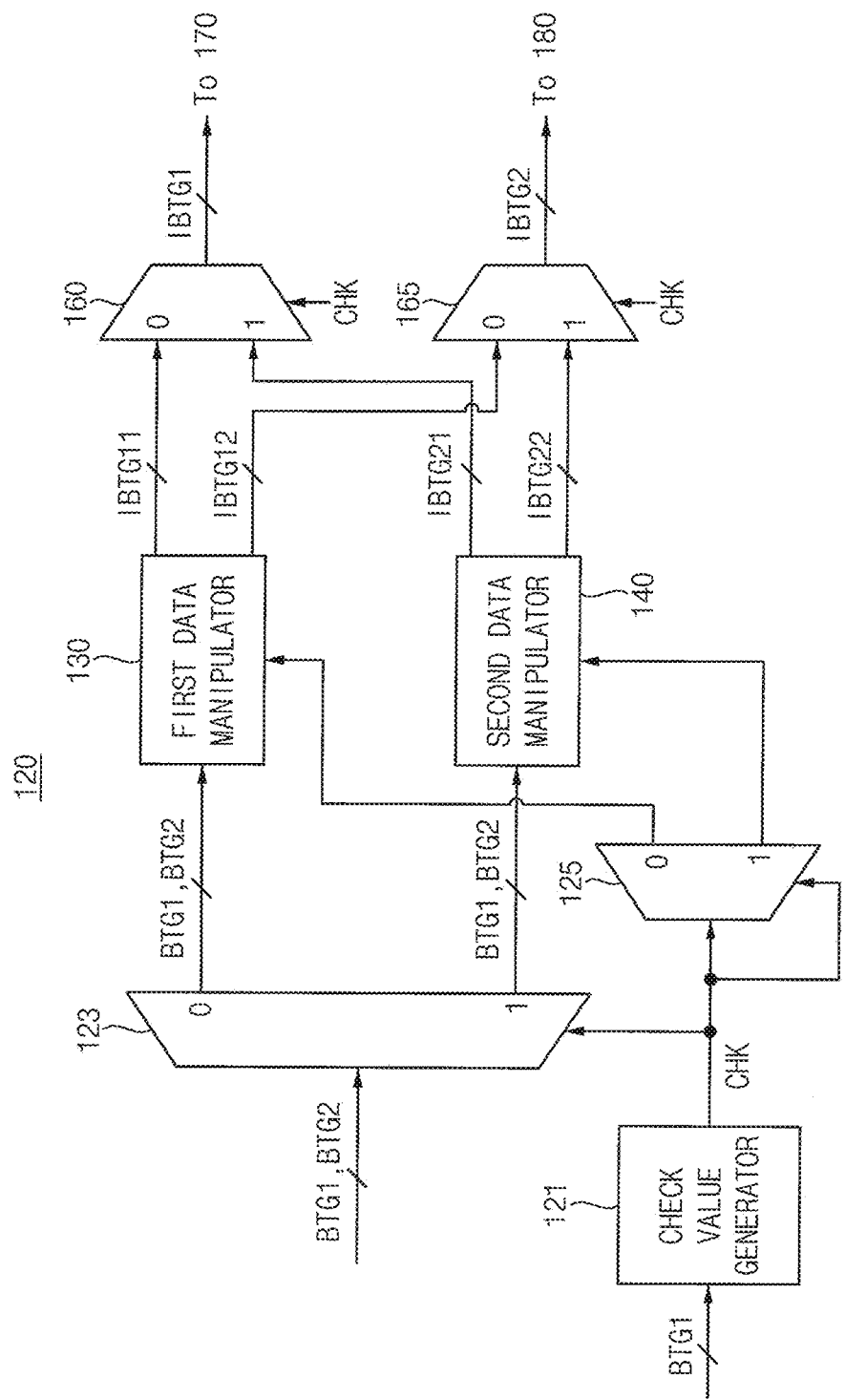
FIG. 3 is a block diagram illustrating an example of the intermediate data generator in the transmitter of FIG. 2 according to some example embodiments.

FIG. 3 is a block diagram illustrating an example of the intermediate data generator in the transmitter of FIG. 2 according to some example embodiments.

Referring to FIG. 3, the intermediate data generator 120 may include a check value generator 121, a first demultiplexer 123, a second demultiplexer 125, a first data manipulator, 130, a second data manipulator 140, a first multiplexer 160 and a second multiplexer 165.

The check value generator 121 may receive the first bit group BTG1 and may generate a check value CHK indicating whether a value of the first bit group BTG1 is equal to or greater than a first threshold value.

The check value generator 121 may generate the check value CHK having a first logic level (e.g., a logic low level) in response to the value of the first bit group BTG1 being smaller than the first threshold value and may generate the check value CHK having a second logic level (e.g., a logic high level) in response to the value of the first bit group BTG1 being equal to or greater than the first threshold value. For example, the first threshold value may be 26.

The first demultiplexer 123 may receive the first bit group BTG1 and the second bit group BTG2, may provide the first bit group BTG1 and the second bit group BTG2 to the first data manipulator 130 in response to the check value CHK indicating that the value of the first bit group BTG1 is smaller than the first threshold value and may provide the first bit group BTG1 and the second bit group BTG2 to the second data manipulator 140 in response to the check value CHK indicating that the value of the first bit group BTG1 is equal to or greater than the first threshold value.

The second demultiplexer 125 may receive the check value CHK, may provide the check value CHK to the first data manipulator 130 in response to the check value CHK indicating that the value of the first bit group BTG1 is smaller than the first threshold value and may provide the check value CHK to the second data manipulator 140 in response to the check value CHK indicating that the value of the first bit group BTG1 is equal to or greater than the first threshold value.

The first data manipulator 130 may generate a first sub intermediate bit group IBTG11 and a second sub intermediate bit group IBTG12 by manipulating the first bit group BTG1 and the second bit group BTG2 according to a first scheme, respectively, in response to the value of the first bit group BTG1 being smaller than the first threshold value and based on the check value CHK. The first data manipulator 130, in response to the value of the first bit group BTG1 being smaller than the first threshold value, may generate the first sub intermediate bit group IBTG11 based on the first bit group BTG1 and may generate the second sub intermediate bit group IBTG12 based on the second bit group BTG2 and the check value CHK.

The second data manipulator 140 may generate a third sub intermediate bit group IBTG21 and a fourth sub intermediate bit group IBTG22 by manipulating the first bit group BTG1 and the second bit group BTG2 according to a second scheme different from the first scheme, respectively, in response to the value of the first bit group BTG1 being equal to or greater than the first threshold value and based on the check value CHK. The second data manipulator 140, in response to the value of the first bit group BTG1 being equal to or greater than the first threshold value, may generate the third sub intermediate bit group IBTG21 based on the first bit group BTG1 and the second bit group BTG2, and may generate the fourth sub intermediate bit group IBTG22 based on the check value CHK and the second bit group BTG2. Here, the first scheme and the second scheme may include circuitry configured to perform certain mathematical operations. For example, the first bit group BTG1 and the second bit group BTG2 may be used by the first data manipulator 130 to generate the first sub intermediate bit group IBTG11 and the second sub intermediate bit group IBTG12 based on circuitry configured to perform the first scheme. For example, the first bit group BTG1 and the second bit group BTG2 may be used by the second data manipulator 140 to generate the third sub intermediate bit group IBTG21 and the fourth sub intermediate bit group IBTG22 based on circuitry configured to perform the second scheme.

The first multiplexer 160 may receive the first sub intermediate bit group IBTG11 and the third sub intermediate bit group IBTG21 and may output one of the first sub intermediate bit group IBTG11 and the third sub intermediate bit group IBTG21 as the first intermediate bit group IBTG1, based on the check value CHK.

The second multiplexer 160 may receive the second sub intermediate bit group IBTG12 and the fourth sub intermediate bit group IBTG22 and may output one of the second sub intermediate bit group IBTG12 and the fourth sub intermediate bit group IBTG22 as the second intermediate bit group IBTG2, based on the check value CHK.

The first multiplexer 160 may provide the first sub intermediate bit group IBTG11 as the first intermediate bit group IBTG1 in response to the check value CHK having a first logic level (e.g., in response to the value of the first bit group BTG1 being smaller than the first threshold value) and may provide the third sub intermediate bit group IBTG21 as the first intermediate bit group IBTG1 in response to the check value CHK having a second logic level (e.g., in response to the value of the first bit group BTG1 being equal to or greater than the first threshold value).

The second multiplexer 165 may provide the second sub intermediate bit group IBTG12 as the second intermediate bit group IBTG2 in response to the check value CHK having a first logic level and may provide the fourth sub intermediate bit group IBTG22 as the second intermediate bit group IBTG2 in response to the check value CHK having a second logic level.

When the check value CHK has a first logic level and indicates that the value of the first bit group BTG1 is smaller than the first threshold value, the first data manipulator 130 generates the first sub intermediate bit group IBTG11 and the second sub intermediate bit group IBTG12 by manipulating the first bit group BTG1 and the second bit group BTG2 according to the first scheme, respectively, and the first multiplexer 160 and the second multiplexer 165 provide the first sub intermediate bit group IBTG11 and the second sub intermediate bit group IBTG12 as the first intermediate bit group IBTG1 and the second intermediate bit group IBTC2, respectively.

When the check value CHK has a second logic level and indicates that the value of the first bit group BTG1 is equal or greater than the first threshold value, the first data manipulator 130 generates the third sub intermediate bit group IBTG21 and the fourth sub intermediate bit group IBTG22 by manipulating the first bit group BTG1 and the second bit group BTG2 using the check value CHK and according to the second scheme, respectively, and the first multiplexer 160 and the second multiplexer 165 provide the third sub intermediate bit group IBTG21 and the fourth sub intermediate bit group IBTG22 as the first intermediate bit group IBTG1 and the second intermediate bit group IBTC2, respectively.

FIG. 4 illustrates an operation of the first data manipulator in the intermediate data generator of FIG. 3 according to some example embodiments.

Referring to FIGS. 3 and 4, in response to the value of the first bit group BTG1 being smaller than the first threshold value, the first data manipulator 130 provides the first bit group BTG1 including first binary input bits b0, b1, b2, b3 and b4 as the first sub intermediate bit group IBTG11 (operation S111), provides the check value CHK and second bit group BTG2 including second binary input bits b5, b6, b7, b8, b9 and b10 as the second sub intermediate bit group IBTG12 (operation S112), and the first multiplexer 160 and the second multiplexer 165 output the first sub intermediate bit group IBTG11 and the second sub intermediate bit group IBTG12 as the first intermediate bit group IBTG1 (operation 5113) and the second intermediate bit group IBTC2 (operation S114), respectively.

Therefore, when the value of the first bit group BTG1 is smaller than the first threshold value, each of first intermediate bits Ib0, Ib1, Ib2, Ib3 and Ib4 of the first intermediate bit group IBTG1 is the same as a respective one of the first binary input bits b0, b1, b2, b3 and b4, and each of second intermediate bits Ib5, Ib6, Ib7, Ib8, Ib9, Ib10 and Ib11 of the second intermediate bit group IBTG2 is the same as a respective one of the check value CHK and the second binary input bits b5, b6, b7, b8, b9 and b10.

FIG. 5 illustrates an operation of the second data manipulator in the intermediate data generator of FIG. 3 according to some example embodiments.

Referring to FIGS. 3 and 5, in response to the value of the first bit group BTG1 being equal to or greater than the first threshold value, the second data manipulator 140 provides a manipulated portion b2×b3, b3' and b4 of the first binary input bits b0, b1, b2, b3 and b4 of the first bit group BTG1 and a portion b5 and b6 of the second binary input bits b5, b6, b7, b8, b9 and b10 of the second bit group BTG2 as the third sub intermediate bit group IBTG21 (operation S211), provides the check value CHK, specific constants 0 and 0 and a remaining portion b7, b8, b9 and b10 of the second binary input bits b5, b6, b7, b8, b9 and b10 of the second bit group as the fourth sub intermediate bit group IBTG22 (operation S212), and the first multiplexer 160 and the second multiplexer 165 output the third sub intermediate bit group IBTG21 and the fourth sub intermediate bit group IBTG22 as the first intermediate bit group IBTG1 (operation 5213) and the second intermediate bit group IBTC2 (operation S214), respectively.

Here, "x" denotes a logical multiplication and " ' " denotes a logical NOT.

Therefore, when the value of the first bit group BTG1 is equal to or greater than the first threshold value, each of first intermediate bits Ib0, Ib1, Ib2, Ib3 and Ib4 of the first intermediate bit group IBTG1 corresponds to respective one of b2×b3, b3', b4, b5 and b6, and each of second intermediate bits Ib5, Ib6, Ib7, Ib8, Ib9, Ib10 and Ib11 of the second intermediate bit group IBTG2 corresponds to respective one of CHK, 0, 0, b7, b8, b9 and b10.

The first intermediate bit group IBTG1 may include a second number of the first intermediate bits Ib0, Ib1, Ib2, Ib3 and Ib4, and the second intermediate bit group may include a fourth number of the second intermediate bits Ib5, Ib6, Ib7, Ib8, Ib9, Ib10 and Ib11 and the fourth number is greater than the third number by one. The fourth number may be 7.

Figure 6:
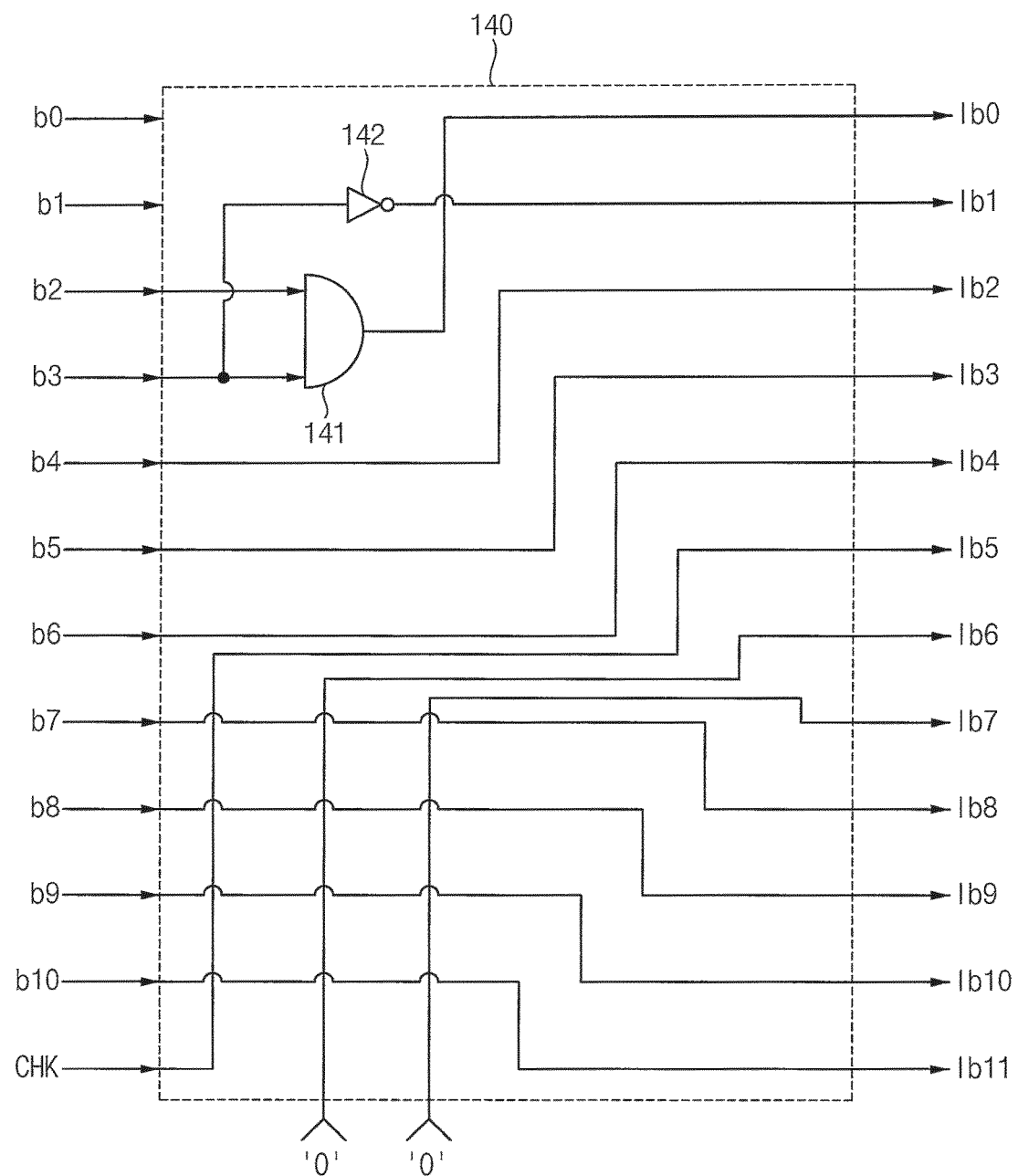
FIG. 6 illustrates an example of the second data manipulator in the intermediate data generator of FIG. 3 according to some example embodiments.

FIG. 6 illustrates an example of the second data manipulator in the intermediate data generator of FIG. 3 according to some example embodiments.

Referring to FIG. 6, the second data manipulator 140 may include an AND gate 141 and an inverter 142.

The AND gate 141 may perform an AND operation on binary input bits b2 and b3 and provide a result of the AND operation as an intermediate bit Ib0. The inverter 142 may provide an intermediate bit Ib1 by inverting a binary input but B3 and a specific constant "0" may be assigned to each of intermediate bits Ib6 and Ib7. In some example embodiments, a specific constant "1" may be assigned to each of intermediate bits Ib6 and Ib7.

In addition, the second data manipulator 140 may provide a binary input bit b4 as an intermediate bit Ib2, may provide a binary input bit b5 as an intermediate bit Ib3, may provide check value CHK as an intermediate bit Ib4, and may provide each of binary input bits b7, b8, b9 and b10 as respective one of intermediate bits Ib8, Ib9, Ib10 and Ib11.

Figure 7:
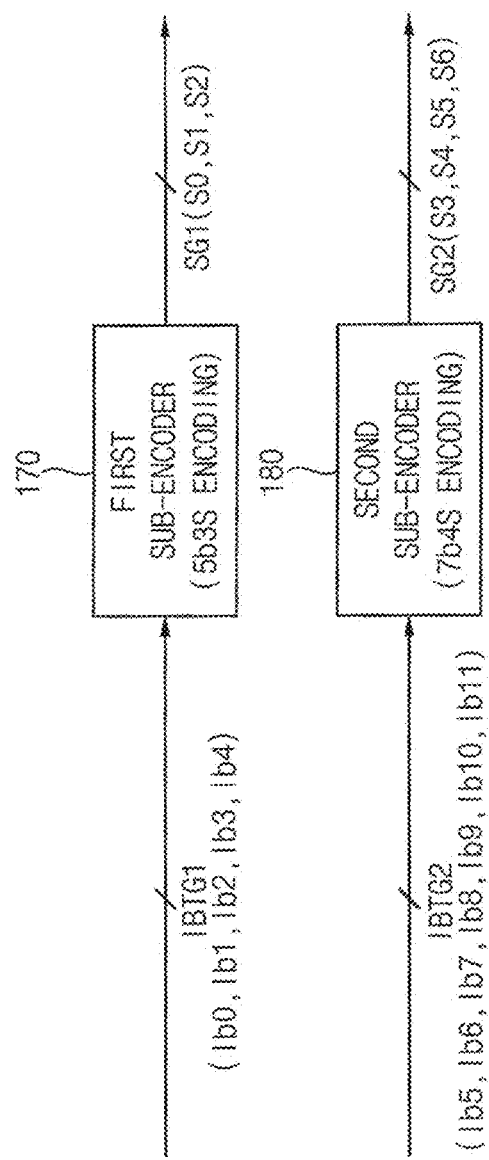
FIG. 7 illustrates operations of the first sub encoder and the second sub encoder in the encoder of FIG. 2 according to some example embodiments.

FIG. 7 illustrates operations of the first sub encoder and the second sub encoder in the encoder of FIG. 2 according to some example embodiments.

Referring to FIG. 7, the first sub encoder 170 may generate the first symbol group SG1 including the first three symbols S0, S1 and S2 by performing a first encoding of 5-bit to 3-symbol (5b3S) on the first intermediate bit group IBTG1 including the first intermediate bits Ib0, Ib1, Ib2, Ib3 and Ib4. The second sub encoder 180 may generate the second symbol group SG2 including the second four symbols S3, S4, S5 and S6 by performing a second encoding of 7-bit to 4-symbol (7b4S) on the second intermediate bit group IBTG2 including the second intermediate bits Ib5, Ib6, Ib7, Ib8, 1119 and Ib10.

The first sub encoder 170 may perform the first encoding in parallel with the second sub encoder 180 performing the second encoding.

The encoder 110 in the transmitter 100 of FIG. 2, instead of encoding 11-bit of binary input bits b0, b1, b2, b3, b4, b5, b6, b7, b8, b9 and b10 into seven symbols at one time, may divide the 11-bit of binary input bits b0, b1, b2, b3, b4, b5, b6, b7, b8, b9 and b10 into the first bit group BTG1 including a second number of binary input bits b0, b1, b2, b3 and b4 and the second bit group BTG2 including a third number of binary input bits b5, b6, b7, b8, b9 and b10, may generate the first intermediate bit group IBTG1 and the second intermediate bit group IBTG2 by manipulating the first bit group BTG1 and the second bit group BTG2 differently according to the value of the first bit group BTG1 and may generate the first symbol group SG1 including the first three symbols S0, S1 and S2 and the second symbol group SG2 including the second four symbols S3, S4, S5 and S6 by encoding the first intermediate bit group IBTG1 and the second intermediate bit group IBTG2 in parallel.

Therefore, the encoder 110 may reduce an occupied area and power consumption when compared with a case that the encoder 110 encodes 11-bit of binary input bits b0, b1, b2, b3, b4, b5, b6, b7, b8, b9 and b10 into seven symbols at one time.

FIG. 8 illustrates an example of a first look-up table that the first sub encoder in FIG. 7 uses according to some example embodiments.

Referring to FIG. 8, the first sub encoder 170 in FIG. 7 may perform a first encoding of 5-bit to 3-symbol (5b3S) by using a first look-up table LUT1 indicating mapping relation between the first intermediate bits Ib0, Ib1, Ib2, Ib3 and Ib4 and the first symbols S0, S1 and S2.

In FIG. 8, Ib(0:4) denotes the first intermediate bits Ib0, Ib1, Ib2, Ib3 and Ib4, and when the value of the first bit group BTG1 is smaller than the first threshold value (e.g., 26), each of first intermediate bits Ib0, Ib0, Ib2, Ib3 and Ib4 of the first intermediate bit group IBTG1 is the same as respective one of the first binary input bits b0, b1, b2, b3 and b4 as mentioned above. Therefore, Ib(0:4) in FIG. 8 corresponds to the first binary input bits b0, b1, b2, b3 and b4.

When the first binary input bits b0, b1, b2, b3 and b4 are mapped to the first symbols S0, S1 and S2, $2^5$ (i.e., 32) combinations are possible.

When the value of the first bit group BTG1 is equal to or greater than the first threshold value (e.g., 26), the first binary input bits b0, b1, b2, b3 and b4 are not assigned to the first symbols S0, S1 and S2. When a value of the first binary input bits b0, b1, b2, b3 and b4 corresponds to one of '0' through '25', the first binary input bits b0, b1, b2, b3 and b4 are mapped to the first symbols S0, S1 and S2.

The symbol S0 may represent 2-bit t[0:1] of the output data signal TX_OUT, the symbol S1 may represent 2-bit t[2:3] of the output data signal TX_OUT, and the symbol S2 may represent 2-bit t[4:5] of the output data signal TX_OUT.

FIG. 9 is an example table that implements the first look-up table of FIG. 8 with gate-level logic.

Referring to FIG. 9, the check value CHK and bits t0, t1, t2, t3, t4 and t5 of the output data signal TX_OUT in the first look-up table LUT1 are represented as following expression 1.

$CHK = Ib0 \times Ib1 \times Ib3 + Ib0 \times Ib1 \times Ib2$     [Expression 1]

$t0 = Ib0' + Ib1$ $t1 = Ib0 \times Ib1 \times Ib4 + Ib0' \times Ib1'$ $t2 = Ib0 \times Ib2' + Ib1' \times Ib2' + Ib2 \times Ib4$ $t3 = Ib2' \times Ib3 + Ib3 \times Ib4$ $t4 = Ib0' \times Ib4 + Ib1' \times Ib4 + Ib2$ $t5 = bI2 \times Ib4 + Ib2 \times Ib3$ The bits t0, t1, t2, t3, t4 and t5 of the output data signal TX_OUT may be obtained based on combinations of the first intermediate bits Ib0, Ib1, Ib2, Ib3 and Ib4.

FIGS. 10A, 10B and 10C illustrate an example of a second look-up table that the second sub encoder in FIG. 7 uses according to some example embodiments.

Referring to FIGS. 10A, 10B and 10C, the first sub encoder 180 in FIG. 7 may perform a second encoding of 7-bit to 4-symbol (7b4S) by using a second look-up table LUT2 indicating mapping relation between the second intermediate bits Ib5, Ib6, Ib7, Ib8, Ib9 and Ib10 and the second symbols S3, S4, S5 and S6.

In FIGS. 10A, 10B and 10C, Ib[5:11] denotes the second intermediate bits Ib5, Ib6, Ib7, Ib8, Ib9, Ib10 and Ib11 and when the value of the second intermediate bits second intermediate bits Ib5, Ib6, Ib7, Ib8, Ib9, Ib10 and Ib11 is equal to or greater than the 80 (e.g., a second threshold value), the second intermediate bits second intermediate bits Ib5, Ib6, Ib7, Ib8, Ib9, Ib10 and Ib11 are not mapped to the second symbols S3, S4, S5 and S6. When the second intermediate bits second intermediate bits Ib5, Ib6, Ib7, Ib8, Ib9, Ib10 and Ib11 are mapped to the second symbols S3, S4, S5 and S6, $2^7$ (i.e., 128) combinations are possible, however, the second sub encoder 180 may use 80 combinations when the value of the second intermediate bits second intermediate bits Ib5, Ib6, Ib7, Ib8, Ib9, Ib10 and Ib11 corresponds to one of '0' through '79' and the second sub encoder 180 does not use the combinations in which the value of the second intermediate bits second intermediate bits Ib5, Ib6, Ib7, Ib8, Ib9, Ib10 and Ib11 is equal to or greater than 80.

The symbol S3 may represent 2-bit 46:71 of the output data signal TX_OUT, the symbol S4 may represent 2-bit 48:91 of the output data signal TX_OUT, the symbol S5 may represent 2-bit t[10:11] of the output data signal TX_OUT, and the symbol S6 may represent 2-bit t[12:13] of the output data signal TX_OUT.

Referring to the first look-up table LUT1 in FIG. 8 and the second look-up table LUT2 in FIGS. 10A, 10B and 10C, when the value of the first bit group BTG1 is smaller than the first threshold value, the first sub encoder 170 in FIG. 7 may generate 26 combinations of the first symbols S0, S1 and S2 based on the first binary input bits b0, b1, b2, b3 and b4 and the second first sub encoder 180 in FIG. 7 may generate 64 combinations of the second symbols S3, S4, S5 and S6 based on the second binary input bits b5, b6, b7, b8, b9 and b10. Therefore, when the value of the first bit group BTG1 is smaller than the first threshold value, the first sub encoder 170 and the second sub encoder 180 in FIG. 7 may generate 1664 (i.e., 26×64) combinations of symbols S0, S1, S2, S3, S4, S5 and S6.

In addition, when the value of the first bit group BTG1 is equal to or greater than the first threshold value, the first sub encoder 170 may generate 24 combinations of the first symbols S0, S1 and S2 based on the first binary input bits b0, b1, b2, b3 and b4 and a portion b5 and b6 of the second binary input bits b5, b6, b7, b8, b9 and b10 and the second first sub encoder 180 may generate 16 combinations of the second symbols S3, S4, S5 and S6 based on a remaining portion b7, b8, b9 and b10 of the second binary input bits b5, b6, b7, b8, b9 and b10. Therefore, when the value of the first bit group BTG1 is equal to or greater than the first threshold value, the first sub encoder 170 and the second sub encoder 180 in FIG. 7 may generate 384 (i.e., 24×16) combinations of symbols S0, S1, S2, S3, S4, S5 and S6.

Therefore, the encoder 110 may generate 2048 combinations of symbols S0, S1, S2, S3, S4, S5 and S6 based on the first number of the binary input bits b0, b1, b2, b3, b4, b5, b6, b7, b8, b9 and b10.

FIG. 11 is an example table that implements the second look-up table of FIGS. 10A, 10B and 10C with gate-level logic.

Referring to FIG. 11, bits t6, t7, t8, t9, t10, t11, t12 and t13 of the output data signal TX_OUT in the second look-up table LUT2 are represented as following expression 2.

$$t6 = Ib5' \times Ib6' + Ib8 \times Ib9' + Ib8 \times Ib11 + Ib6 \times Ib8 \quad \text{[Expression 2]}$$

$$t7 = Ib5 \times Ib8 \times Ib9' \times Ib10 + Ib5 \times Ib8 \times Ib10 \times Ib11 + Ib6' \times Ib7 + Ib7 \times Ib8$$

$$t8 = Ib5' \times Ib8 + Ib8 \times Ib11 + Ib8 \times Ib9 + Ib6$$

$$t9 = Ib5 \times Ib8 \times Ib9 \times Ib11 + Ib5 \times Ib8 \times Ib9 \times Ib10 + Ib6 \times Ib8 + Ib6 \times Ib7$$

$$t10 = Ib5' \times Ib9' + Ib8' \times Ib9' + Ib5' \times Ib11 + Ib8' \times Ib11$$

$$t11 = Ib5' \times Ib9' \times Ib10 + Ib8' \times Ib9' \times Ib10 + Ib5' \times Ib10 \times Ib11 + Ib8' \times Ib10 \times Ib11$$

$$t12 = Ib5' \times Ib11 + Ib8' \times Ib11 + Ib5' \times Ib9 + Ib8' \times Ib9$$

$$t13 = Ib5 \times Ib9 \times Ib11 + Ib8' \times Ib9 \times Ib11 + Ib5' \times Ib9 \times Ib10 + Ib8' \times Ib9 \times Ib10$$

The bits t6, t7, t8, t9, t10, t11, t12 and t13 of the output data signal TX_OUT may be obtained based on combination of the second intermediate bits Ib5, Ib6, Ib7, Ib8, Ib9, Ib10 and Ib11.

Figure 12:
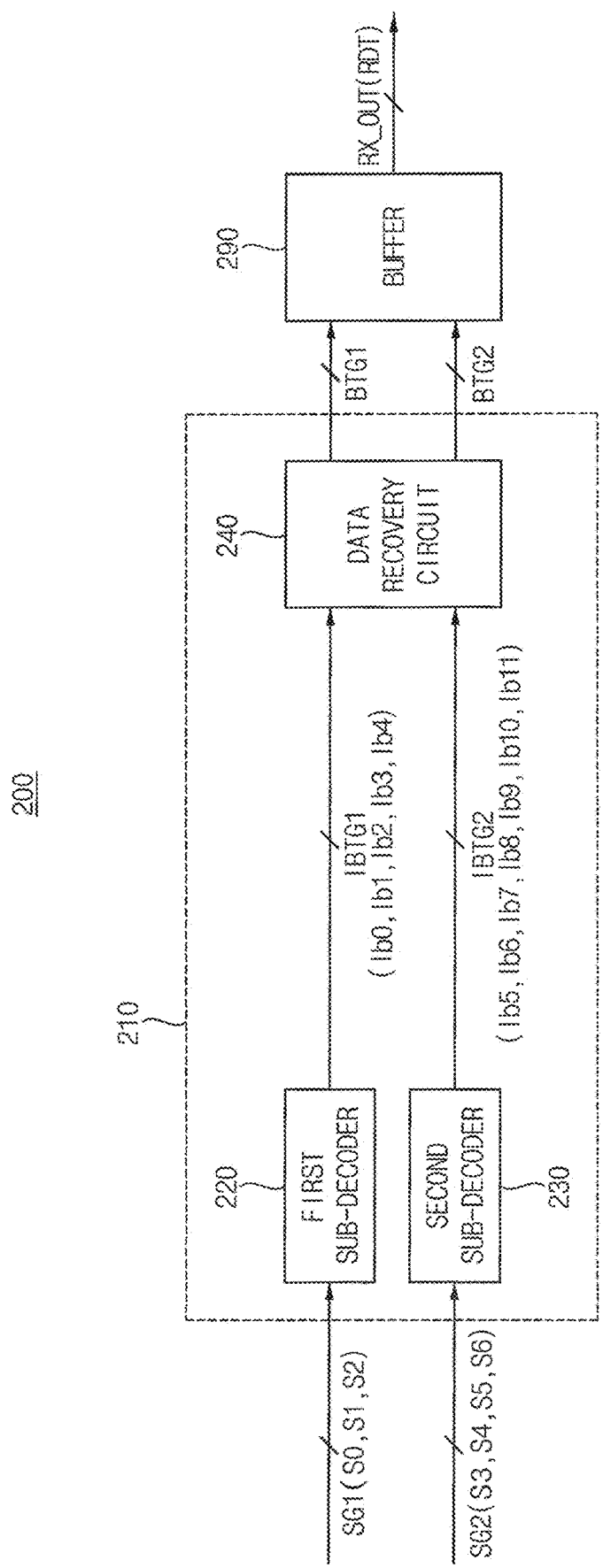
FIG. 12 is a block diagram illustrating an example of the receiver in FIG. 1 according to some example embodiments.

FIG. 12 is a block diagram illustrating an example of the receiver in FIG. 1 according to some example embodiments.

Referring to FIG. 12, the receiver 200 may include a decoder 210 and a buffer 290.

The decoder 210 may generate a first intermediate bit group IBTG1 and a second intermediate bit group IBTG2 by decoding a first symbol group SG1 and a second symbol group SG2 of an input data signal (RX_IN in FIG. 1), respectively, each of which includes a plurality of symbols having three different voltage levels, and may generate a first bit group BTG1 and a second bit group BTG2 by manipulating the first intermediate bit group IBTG1 and the second intermediate bit group IBTG2 differently based on a value of a specific bit of the second intermediate bit group IBTG2.

The buffer 290 may generate an output data signal RX_OUT including a first number of binary output bits by buffering the first bit group BTG1 and the second bit group BTG2. The output data signal RX_OUT may be referred to as a recovered data signal RDT.

The decoder 210 may include a first sub decoder 220, a second sub decoder 230 and a data recovery circuit 240.

The first sub decoder 220 may generate the first intermediate bit group IBTG1 including first intermediate bits Ib0, Ib1, Ib2, Ib3 and Ib4 by decoding the first symbol group SG1 including first symbols S0, S1 and S2.

The second sub decoder 230 may generate the second intermediate bit group IBTG2 including second intermediate bits Ib5, Ib6, Ib7, Ib8, Ib9, Ib10 and Ib11 by decoding the second symbol group SG2 including second symbols S3, S4, S5 and S6.

The first sub decoder 220 may generate the first intermediate bit group IBTG1 including the first intermediate bits Ib0, Ib1, Ib2, Ib3 and Ib4 of five bits by perform a first decoding of 3-symbol to 5-bit (3S5b) on the first symbol group SG1 including the first three symbols S0, S1 and S2.

The second sub decoder 220 may generate the second intermediate bit group IBTG2 the second intermediate bits Ib5, Ib6, Ib7, Ib8, Ib9, Ib10 and Ib11 of seven bits by perform a second decoding of 4-symbol to 7-bit (4S7b) on the second symbol group SG2 including the second four symbols S3, S4, S5 and S6.

The first sub decoder 220 may perform the first decoding in parallel with the second sub decoder 230 performing the second decoding.

The data recovery circuit 240 may recover the first bit group BTG1 and the second bit group BTG2 by manipulating the first intermediate bit group IBTG1 and the second intermediate bit group IBTG2 differently based on a value of the specific bit of the second intermediate bit group IBTG2.

Figure 13:
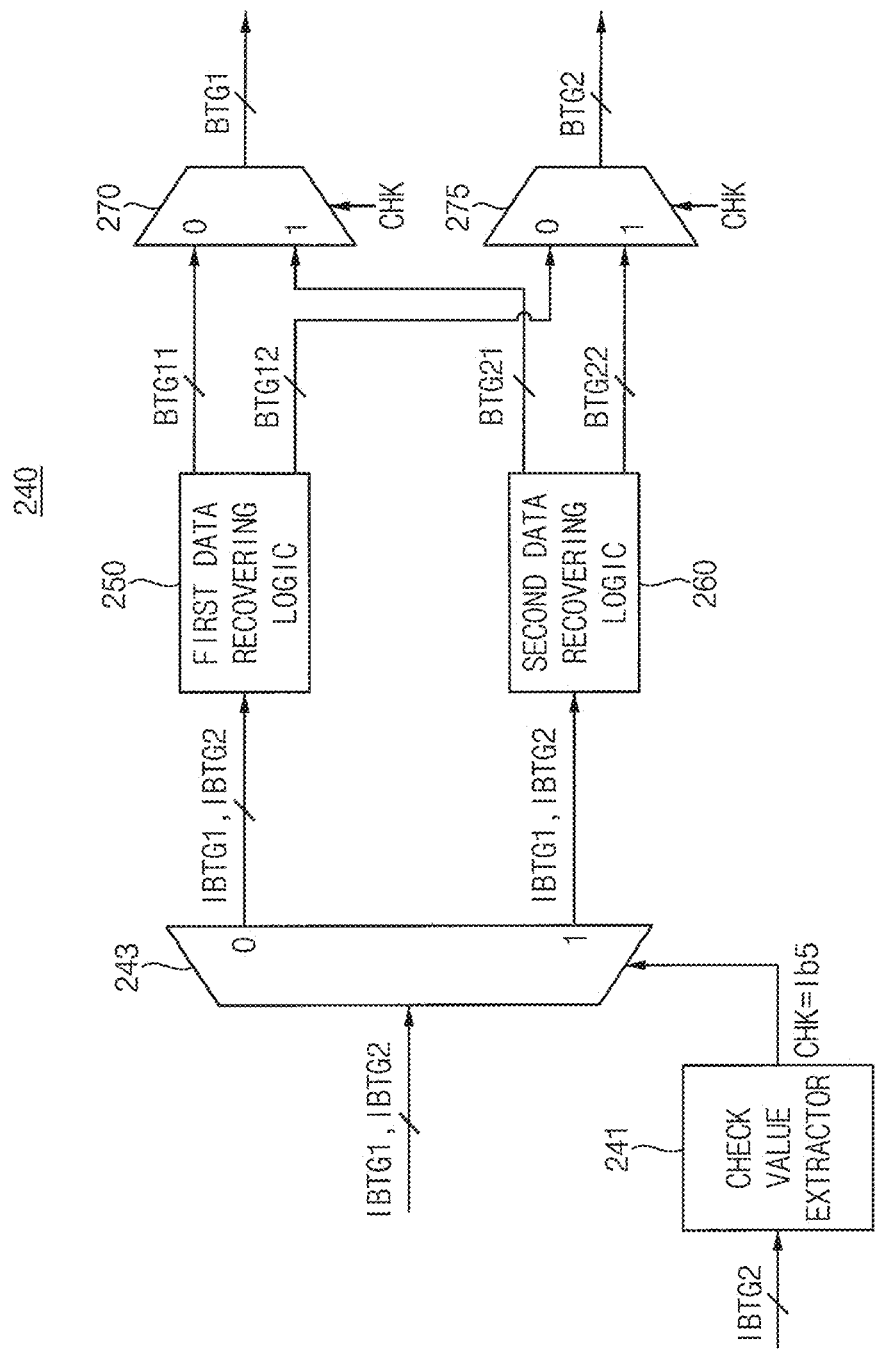
FIG. 13 is a block diagram illustrating an example of the data recovery circuit in the receiver of FIG. 12 according to some example embodiments.

FIG. 13 is a block diagram illustrating an example of the data recovery circuit in the receiver of FIG. 12 according to some example embodiments.

Referring to FIG. 13, the data recovery circuit 240 may include a check value extractor 241, a demultiplexer 243, a first data recovering logic 250, a second data recovering logic 260, a first multiplexer 270 and a second multiplexer 275.

The check value extractor 241 may output a check value CHK by extracting a specific bit from the second intermediate bits Ib5, Ib6, Ib7, Ib8, Ib9, Ib10 and Ib11 of the second intermediate bit group IBTG2. The check value extractor 241 may extract a first bit Ib5 from the second intermediate bits Ib5, Ib6, Ib7, Ib8, Ib9, Ib10 and Ib11 as the check value CHK and may provide the check value CHK to the demultiplexer 243, the first multiplexer 270 and the second multiplexer 275.

The demultiplexer 243 may provide the first intermediate bit group IBTG1 and the second intermediate bit group IBTG2 to the first data recovering logic 250 in response to the check value CHK having a first logic level (e.g., a logic low level), and may provide the first intermediate bit group IBTG1 and the second intermediate bit group IBTG2 to the second data recovering logic 260 in response to the check value CHK having a second logic level (e.g., a logic high level).

The first data recovering logic 250 may generate a first sub bit group BTG11 and a second sub bit group BTG12 by manipulating the first intermediate bit group IBTG1 and the second intermediate bit group IBTG2 according to a first scheme, respectively, in response to the check value having a first logic level. The second data recovering logic 260 may generate a third sub bit group BTG21 and a fourth sub bit group BTG22 by manipulating the first intermediate bit group IBTG1 and the second intermediate bit group IBTG2 according to a second scheme different from the first scheme, respectively, in response to the check value having a second logic level.

The first multiplexer 270 may receive the first sub bit group BTG11 and the third sub bit group BTG21 and may output one of the first sub bit group BTG11 and the third sub bit group BTG21 as the first bit group BTG1 based on the check value CHK.

The second multiplexer 275 may receive the second sub bit group BTG12 and the fourth sub bit group BTG22 and may output one of the second sub bit group BTG12 and the fourth sub bit group BTG22 as the second bit group BTG2 based on the check value CHK.

The first multiplexer 270 and the second multiplexer 275 may output the first sub bit group BTG11 and the second sub bit group BTG12 as the first bit group BTG1 and the second bit group BTG2, respectively, in response to the check value having a first logic level, and may output the third sub bit group BTG21 and the fourth sub bit group BTG22 as the first bit group BTG1 and the second bit group BTG, respectively, in response to the check value having a second logic level.

Figure 14:
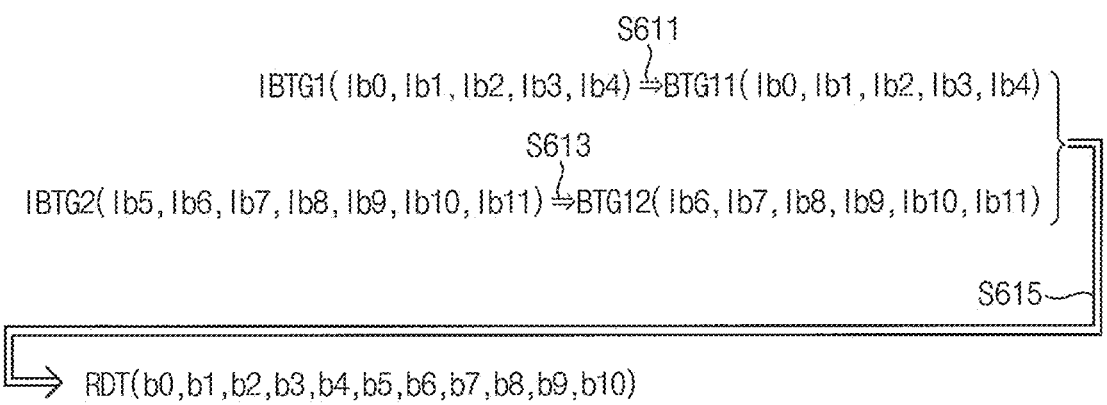
FIG. 14 illustrates an operation of the first data recovering logic in FIG. 13 according to some example embodiments.

FIG. 14 illustrates an operation of the first data recovering logic in FIG. 13 according to some example embodiments.

Referring to FIGS. 13 and 14, in response to the check value having a first logic level, the first data recovering logic 250 provides the first intermediate bit group IBTG1 including the first intermediate bits Ib0, Ib1, Ib2, Ib3 and Ib4 as the first sub bit group BTG11 (operation S611) and provides the second intermediate bits Ib6, Ib7, Ib8, Ib9, Ib10 and Ib11 as the second sub bit group BTG12 by eliminating the first bit Ib5 from the second intermediate bits Ib5, Ib6, Ib7, Ib8, Ib9, Ib10 and Ib11 (operation S613).

In addition, because the first multiplexer 270 and the second multiplexer 275 may output the first sub bit group BTG11 and the second sub bit group BTG12 as the first bit group BTG1 and the second bit group BTG2, respectively, output data bits b0, b1, b2, b3, b4, b5, b6, b7, b8, b9 and b10 of the recovered data signal RDT may include the first intermediate bits Ib0, Ib1, Ib2, Ib3 and Ib4 and the second intermediate bits Ib6, Ib7, Ib8, Ib9, Ib10 (operation S615).

As described with reference to FIG. 4, each of the first intermediate bits Ib0, Ib1, Ib2, Ib3 and Ib4 corresponds to respective one of the bits b0, b1, b2, b3 and b4, and each of the second intermediate bits Ib6, Ib7, Ib8, Ib9, Ib10 corresponds to respective one of the bits b5, b6, b7, b8, b9 and b10.

Figure 15:
FIG. 15 illustrates an operation of the second data recovering logic in FIG. 13 according to some example embodiments.

FIG. 15 illustrates an operation of the second data recovering logic in FIG. 13 according to some example embodiments.

Referring to FIGS. 13 and 15, in response to the check value having a second logic level, the second data recovering logic 260 provides the third sub bit group BTG21 including bits 1, 1, Ib1+Ib0, Ib', Ib2 by filling the specific bit with a specific constant and by manipulating a portion of the first intermediate bits Ib0, Ib1, Ib2, Ib3 and Ib4 of the first intermediate bit group IBTG1 (operation S621), and provides remaining portion Ib3 and Ib4 of the first intermediate bits Ib0, Ib1, Ib2, Ib3 and Ib4 and a portion Ib8, Ib9, Ib10 and Ib11 of the second intermediate bit group IBTG2 as the fourth sub bit group BTG22 (operation S623).

In addition, because the first multiplexer 270 and the second multiplexer 275 may output the third sub bit group BTG21 and the fourth sub bit group BTG22 as the first bit group BTG1 and the second bit group BTG2, respectively, output data bits b0, b1, b2, b3, b4, b5, b6, b7, b8, b9 and b10 of the recovered data signal RDT may include the bits 1, 1, Ib1+Ib0, Ib1 Ib2 and the bits Ib3, Ib4, Ib8, Ib9, Ib10 and Ib11 (operation S625).

FIG. 16 illustrates an example table that represents relationship between bits of the first symbols and the first intermediate bits in the receiver of FIG. 12 according to some example embodiments.

Referring to FIG. 16, a relationship between bits t0, t1, t2, t3, t4 and t5 of the first symbols S0, S1 and S2 and the first intermediate bits Ib0, Ib1, Ib2, Ib3 and Ib4 is represented as following expression 3.

$$Ib0 = t2' \times t4' + t0'$$ [Expression 3]

$$Ib1 = t0 \times t1' + t2 \times t4'$$

$$Ib2 = t2' \times t4' + t5$$

$$Ib3 = t2' \times t5 + t3$$

$$Ib4 = t1 \times t2' \times t4' + t2 \times t4$$

The first sub decoder 220 may use expression 3 when the first sub decoder 220 performs the first decoding by using the first look-up table LUT of FIG. 8.

FIG. 17 illustrates an example table that represents relationship between bits of the second symbols and the second intermediate bits in the receiver of FIG. 12 according to some example embodiments.

Referring to FIG. 17, relationship between bits t6, t7, t8, t9, t10, t11, t12 and t13 of the second symbols S3, S4, S5 and S6 and the second intermediate bits second intermediate bits Ib5, Ib6, Ib7, Ib8, Ib9, Ib10 and Ib11 is represented as following expression 4.

$Ib5 = t6' \times t8' + t10' \times t12'$ [Expression 4]

$Ib6 = t6' \times t8 \times t10 + t6' \times t8 \times t12 + t9 \times t10 + t9 \times t12$ $Ib7 = t6' \times t9 \times t10 + t6' \times t9 \times t12 + t7 \times t10 + t7 \times t12$ $Ib8 = t6 \times t8 + t10 \times t12$ $Ib9 = t10' \times t12 + t6' \times t10' + t9 \times t10' + t9 \times t13$ $Ib10 = t6' \times t9 \times t10' \times t12' + t7 \times t10' \times t12' + t10' \times t13 \times t11$ $Ib11 = t6 \times t8 \times t10' \times t12' + t10 \times t12$ The second sub decoder 230 may use expression 4 when the second sub decoder 230 performs the second decoding.

Figure 18:
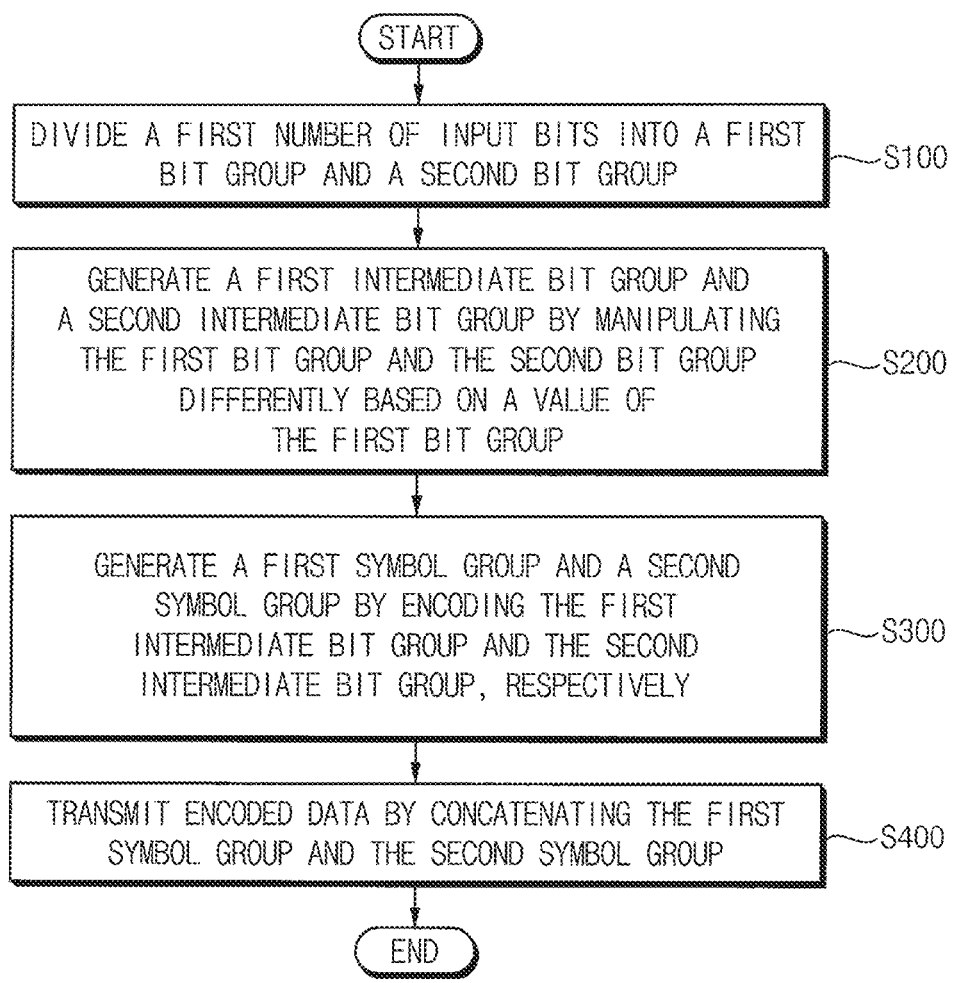
FIG. 18 is a flow chart illustrating a method of operating a transmitter according to some example embodiments.

FIG. 18 is a flow chart illustrating a method of operating a transmitter according to some example embodiments.

Referring to FIGS. 2 through 11 and 18, the encoder 110 of the transmitter 100 divides a first number of binary input bits of the input data signal TX_IN into a first bit group BTG1 and a second bit group BTG2 (operation S100). When the input data signal TX_IN includes a first number of binary input bits b0, b1, b2, b3, b4, b5, b6, b7, b8, b9 and b10, the first bit group BTG1 includes a second number of binary input bits b0, b1, b2, b3 and b4, the second bit group BTG2 includes a third number of binary input bits b5, b6, b7, b8, b9 and b10 and the third number may be greater than the second number.

The intermediate data generator 120 of the encoder 110 generates a first intermediate bit group IBTG1 and a second intermediate bit group IBTG2 by manipulating the first bit group BTG1 and the second bit group BTG2 differently based on a value of the first group BTG1 (operation S200). The first intermediate bit group IBTG1 may include a second number first intermediate bits Ib0, Ib1, Ib2, Ib3 and Ib4 and the second intermediate bit group IBTG2 may include a fourth number of second intermediate bits Ib5, Ib6, Ib7, Ib8, Ib9, Ib10 and Ib11. The fourth number may be greater than the third number.

The first sub encoder 170 and the second sub encoder 180 of the encoder 170 generate a first symbol group SG1 including first symbols S0, S1 and S2 and a second symbol group SG2 including second symbols S3, S4, S5 and S6 by encoding the first intermediate bit group IBTG1 and the second intermediate bit group IBTG2, respectively (operation S300).

The driver 190 may generate the output data signal TX_OUT by concatenating the first symbol group SG1 and the second symbol group SG2 (operation S400) and may transmit the output data signal TX_OUT to the receiver 200 through the channel 50.

Figure 19:
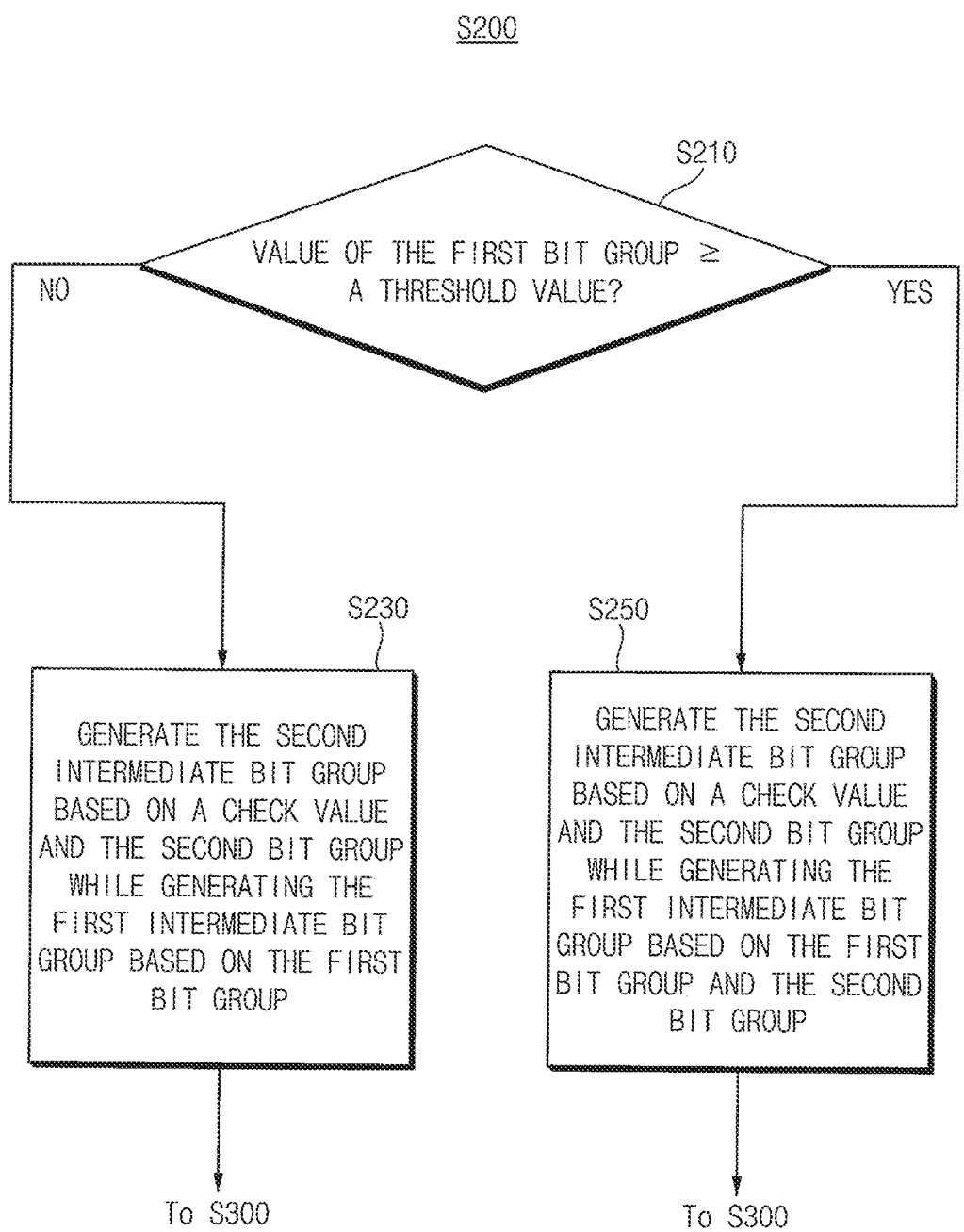
FIG. 19 is a flow chart illustrating operations of generating a first intermediate bit group and a second intermediate bit group.

FIG. 19 is a flow chart illustrating operations of generating a first intermediate bit group and a second intermediate bit group.

Referring to FIGS. 3 and 19, for generating the first intermediate bit group IBTG1 and the second intermediate bit group IBTG2 (operation S200), the check value generator 121 determines whether a value of the first bit group BTG1 (e.g., decimal value of the first bit group BTG1) is equal to or greater than a first threshold value (operation S210). The check value generator 121 receives the first bit group BTG1 and may generate a check value CHK indicating whether the value of the first bit group BTG1 is equal to or greater than the first threshold value.

In response to the value of the check value CHK being smaller than the first threshold value (NO in S210), the first data manipulator 130 and the first multiplexer 160 generates the second intermediate bit group IBTG2 based on the check value CHK and the second bit group BTG2 while generating the first intermediate bit group IBTG1 based on the first bit group BTG1 (operation S230).

In response to the value of the check value CHK being equal to or greater than the first threshold value (YES in S210), the second data manipulator 140 and the second multiplexer 165 generates the second intermediate bit group IBTG2 based on the check value CHK and the second bit group BTG2 while generating the first intermediate bit group IBTG1 based on the first bit group BTG1 and the second bit group BTG2 (operation S250).

Therefore, according to the transmitter and a method of operating a transmitter, the encoder 110, instead of encoding the first number of binary input bits into symbols at one time, divides the first number of binary input into the first bit group including a second number of binary input bits and the second bit group including a third number of binary input bits, generates the first intermediate bit group and the second intermediate bit group by manipulating the first bit group and the second bit group differently according to the value of the first bit group and generates the first symbol group and the second symbol group by encoding the first intermediate bit group and the second intermediate bit group in parallel. Accordingly, the encoder 110 may reduce an occupied area and power consumption.

Figure 20:
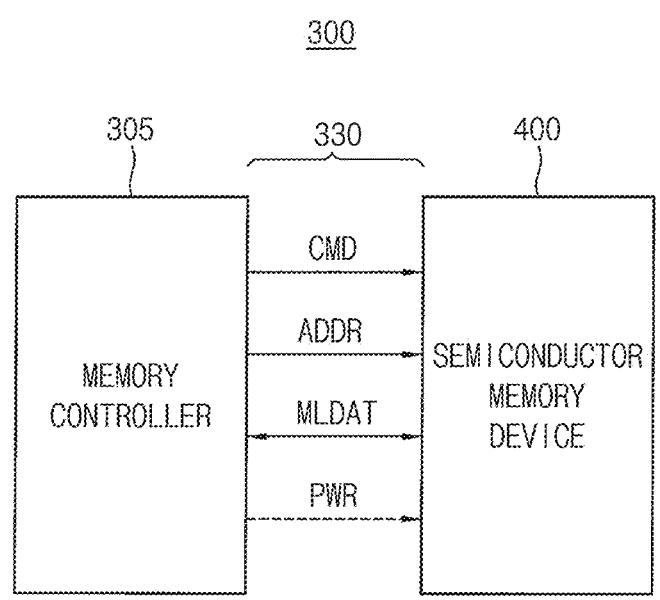
FIG. 20 is a block diagram illustrating a memory system according to some example embodiments.

FIG. 20 is a block diagram illustrating a memory system according to some example embodiments.

Referring to FIG. 20, a memory system 300 may include a memory controller 305 and a semiconductor memory device 400. The memory system 300 may further include a plurality of signal lines 330 that electrically connect the memory controller 305 with the semiconductor memory device 400.

The semiconductor memory device 400 may be controlled by the memory controller 305. For example, based on requests from a host (not illustrated), the memory controller 305 may store (e.g., write or program) data into the semiconductor memory device 400, or may retrieve (e.g., read or sense) data from the semiconductor memory device 400.

The plurality of signal lines 330 may include control lines, command lines, address lines, data input/output (I/O) lines and power lines. The memory controller 305 may transmit a command CMD, an address ADDR and a control signal CTRL to the semiconductor memory device 400 via the command lines, the address lines and the control lines, may exchange a data signal MLDAT with the semiconductor memory device 400 via the data I/O lines, and may transmit a power supply voltage PWR to the semiconductor memory device 400 via the power lines.

For example, a data signal MLDAT may be a PAM-3 multi-level signal that is generated and transmitted according to some example embodiments. Although not illustrated in FIG. 20, the plurality of signal lines 330 may further include data strobe signal (DQS) lines for transmitting a DQS signal.

In some example embodiments, at least a part or all of the signal lines 330 may be referred to as a channel the term "channel" as used herein may represent signal lines that include the data I/O lines for transmitting the data signal MLDAT. However, example embodiments are not limited thereto, and the channel may further include the command lines for transmitting the command CMD and/or the address lines for transmitting the address ADDR.

Figure 21:
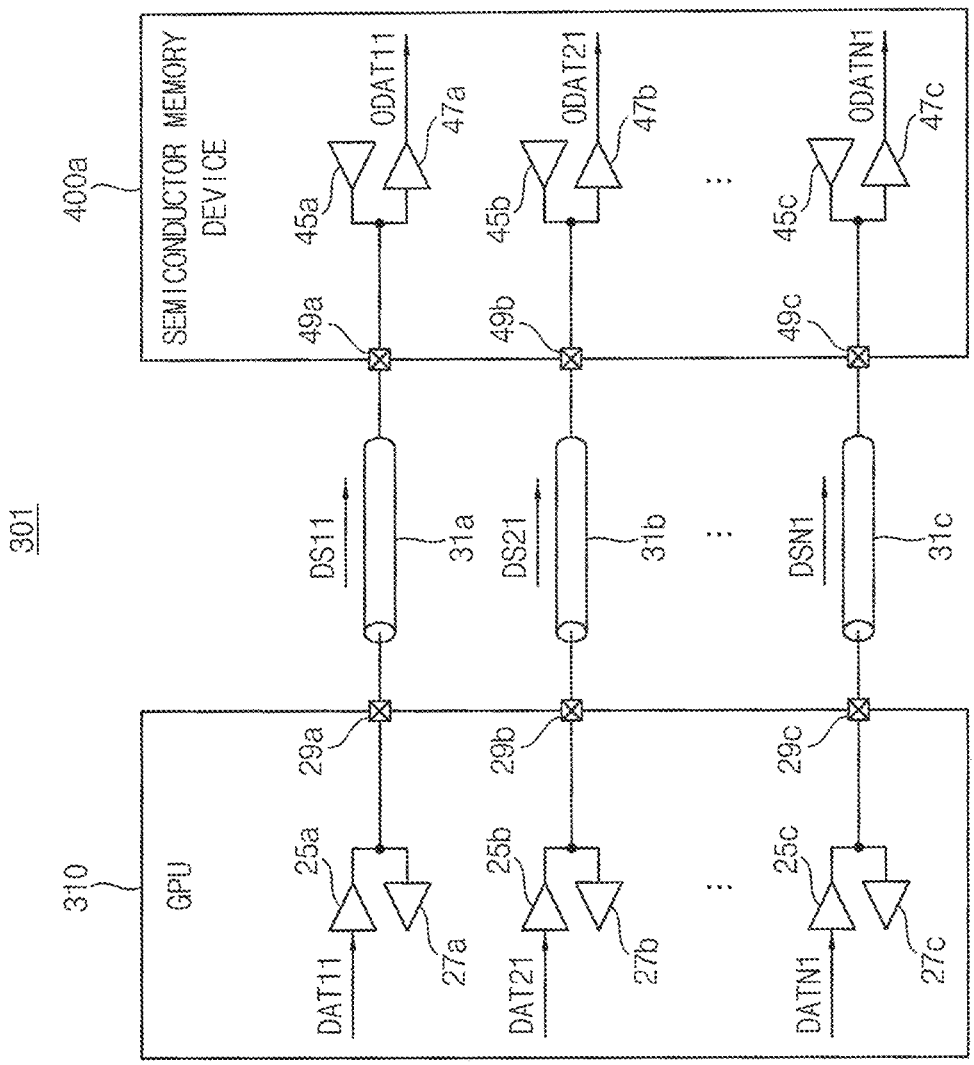
FIGS. 21 and 22 are block diagrams illustrating an example of a memory system of FIG. 20.
Figure 22:
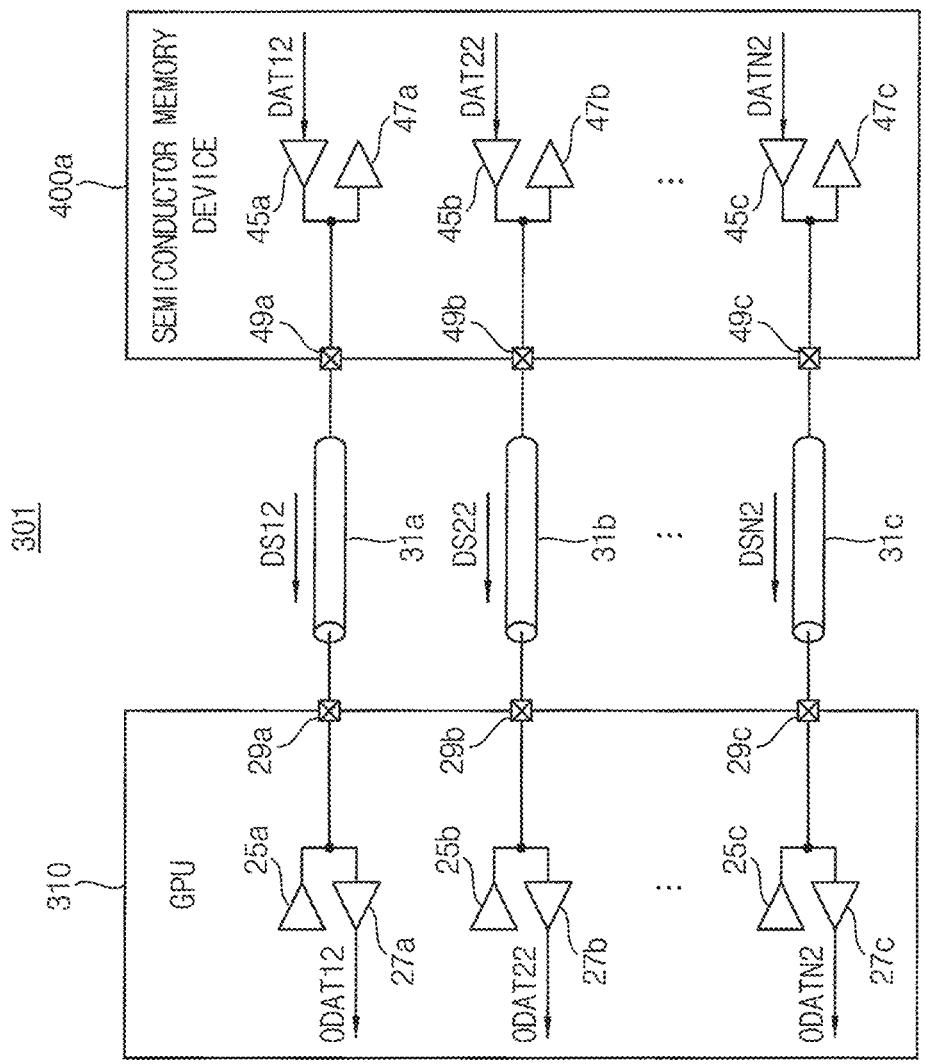

FIGS. 21 and 22 are block diagrams illustrating an example embodiment of a memory system of FIG. 20.

Referring to FIGS. 21 and 22, a memory system 301 may include a graphic processing unit (GPU) 310, a semiconductor memory device 400a and a plurality of channels 31a, 31b and 31c.

The GPU 310 may include a plurality of transmitters 25a, 25b and 25c, a plurality of receivers 27a, 27b and 27c, and a plurality of data I/O pads 29a, 29b and 29c. The semiconductor memory device 400a may include a plurality of transmitters 45a, 45b and 45c, a plurality of receivers 47a, 47b and 47c, and a plurality of data I/O pads 49a, 49b and 49c.

Each of the plurality of transmitters 25a, 25b, 25c, 45a, 45b and 45c may generate a PAM-3 multi-level signal, may perform the method of generating multi-level signal. Each of the plurality of receivers 27a, 27b, 27c, 47a, 47b and 47c may receive the PAM-3 multi-level signal. The plurality of transmitters 25a, 25b, 25c, 45a, 45b and 45c and the plurality of receivers 27a, 27b, 27c, 47a, 47b and 47c may transmit and receive PAM-3 multi-level signal through the plurality of channels 31a, 31b and 31c.

Each of the plurality of transmitters 25a, 25b, 25c, 45a, 45b and 45c may employ the transmitter 100 of FIG. 2 an each of the plurality of receivers 27a, 27b, 27c, 47a, 47b and 47c may employ the receiver 200 of FIG. 12.

Each of the plurality of data I/O pads 29a, 29b, 29c, 49a, 49b and 49c may be connected to a respective one of the plurality of transmitters 25a, 25b, 25c, 45a, 45b and 45c and a respective one of the plurality of receivers 27a, 27b, 27c, 47a, 47b and 47c.

The plurality of channels 31a, 31b and 31c may connect GPU 310 with the semiconductor memory device 400a. Each of the plurality of channels 31a, 31b and 31c may be connected to a respective one of the plurality of transmitters 25a, 25b and 25c and a respective one of the plurality of receivers 27a, 27b and 27c through a respective one of the plurality of data I/O pads 29a, 29b and 29c. In addition, each of the plurality of channels 31a, 31b and 31c may be connected to a respective one of the plurality of transmitters 45a, 45b and 45c and a respective one of the plurality of receivers 47a, 47b and 47c through a respective one of the plurality of data I/O pads 49a, 49b and 49c. The PAM-3 multi-level signal may be transmitted through each of the plurality of channels 31a, 31b and 31c.

FIG. 21 illustrates an operation of transferring data from the GPU 310 to the semiconductor memory device 400a. For example, the transmitter 25a may generate an output data signal DS11, which is the PAM-3 multi-level signal, based on input data DAT11, the output data signal DS11 may be transmitted from the GPU 310 to the semiconductor memory device 400a through the channel 31a, and the receiver 47a may receive the output data signal DS11 to obtain data ODAT11 corresponding to the input data DAT11.

Similarly, the transmitter 25b may generate an output data signal DS21, which is the PAM-3 multi-level signal, based on input data DAT21, the output data signal DS21 may be transmitted to the semiconductor memory device 400a through the channel 31b, and the receiver 47b may receive the output data signal DS21 to obtain data ODAT21 corresponding to the input data DAT21. The transmitter 25c may generate an output data signal DSN1, which is the PAM-3 multi-level signal, based on input data DATN1, the output data signal DSN1 may be transmitted to the semiconductor memory device 400a through the channel 31c, and the receiver 47c may receive the output data signal DSN1 to obtain data ODATN1 corresponding to the input data DATN1. For example, the input data DAT11, DAT21 and DATN1 may write data to be written into the semiconductor memory device 400a.

FIG. 22 illustrates an operation of transferring data from the semiconductor memory device 400a to the GPU 310. For example, the transmitter 45a may generate an output data signal DS12, which is the PAM-3 multi-level signal, based on input data DAT12, the output data signal DS12 may be transmitted from the semiconductor memory device 400a to the GPU 310 through the channel 31a, and the receiver 27a may receive the output data signal DS12 to obtain data ODAT12 corresponding to the input data DAT12.

Similarly, the transmitter 45b may generate an output data signal DS22, which is the PAM-3 multi-level signal, based on input data DAT22, the output data signal DS22 may be transmitted to the GPU 310 through the channel 31b, and the receiver 27b may receive the output data signal DS22 to obtain data ODAT22 corresponding to the input data DAT22. The transmitter 45c may generate an output data signal DSN2, which is the PAM-3 multi-level signal, based on input data DATN2, the output data signal DSN2 may be transmitted to GPU 310 through the channel 31c, and the receiver 27c may receive the output data signal DSN2 to obtain data ODATN2 corresponding to the input data DATN2. For example, the input data DAT12, DAT22 and DATN2 may be read data retrieved from the semiconductor memory device 400a.

Figure 23:
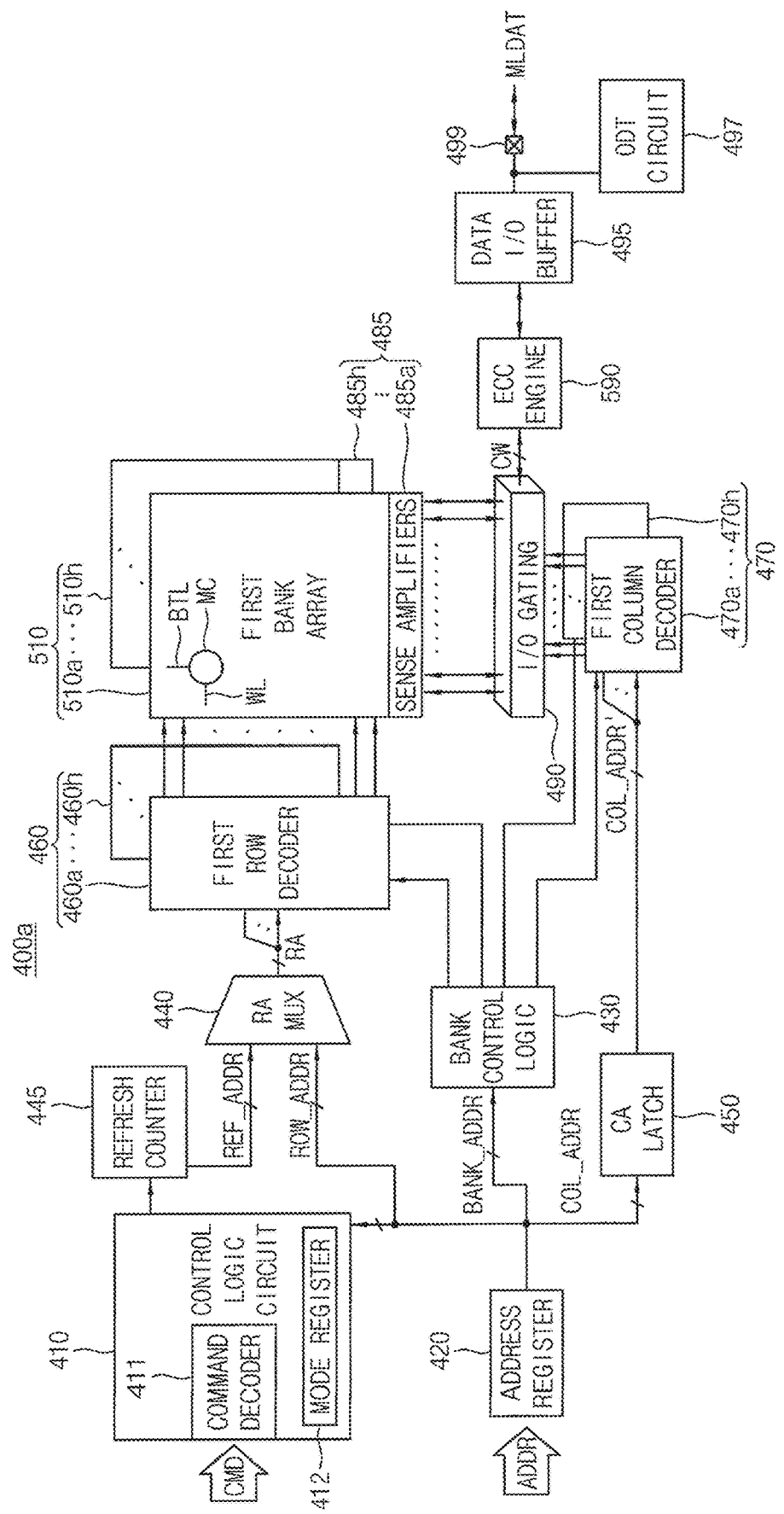
FIG. 23 is a block diagram illustrating an example of the semiconductor memory device included in the memory system of FIGS. 21 and 22 according to some example embodiments.

FIG. 23 is a block diagram illustrating an example of the semiconductor memory device included in the memory system of FIGS. 21 and 22 according to some example embodiments.

Referring to FIG. 23, the semiconductor memory device 400a may include a control logic circuit 410, an address register 420, a bank control logic 430, a refresh counter 445, a row address multiplexer 440, a column address latch 450, a row decoder 460, a column decoder 470, a memory cell array 510, a sense amplifier unit 485, an I/O gating circuit 490, an error correction code (ECC) engine 590, an on-die termination (ODT) circuit 497 and a data I/O buffer 495.

For example, the semiconductor memory device 400a may be a volatile memory device and may include a graphic double data rate 7 GDDR7 synchronous dynamic random access memory (SDRAM) device.

The memory cell array 510 includes first through eighth bank arrays 510a-510h. The row decoder 460 includes first through eighth bank row decoders 460a-460h respectively coupled to the first through eighth bank arrays 510a-510h, the column decoder 470 includes first through eighth bank column decoders 470a-470h respectively coupled to the first through eighth bank arrays 510a-510h, and the sense amplifier unit 485 includes first through eighth bank sense amplifiers 485a-485h respectively coupled to the first through eighth bank arrays 510a-510h.

The first through eighth bank arrays 510a-510h, the first through eighth bank row decoders 460a-460h, the first through eighth bank column decoders 470a-470h and first through eighth bank sense amplifiers 485a-485h may form first through eighth banks. Each of the first through eighth bank arrays 510a-510h may include a plurality of memory cells MC formed at intersections of a plurality of word-lines WL and a plurality of bit-line BTL.

The address register 420 may receive the address ADDR including a bank address BANK_ADDR, a row address ROW_ADDR and a column address COL_ADDR from a memory controller in the GPU 310. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the first through eighth bank row decoders 510a-510h corresponding to the bank address BANK_ADDR is activated in response to the bank control signals, and one of the first through eighth bank column decoders 470a-470h corresponding to the bank address BANK_ADDR is activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 is applied to the first through eighth bank row decoders 460a-460h.

The refresh counter 445 may sequentially output the refresh row address REF_ADDR under control of the control logic circuit 410.

The activated one of the first through eighth bank row decoders 460a-460h, by the bank control logic 430, may decode the row address RA that is output from the row address multiplexer 440, and may activate a word-line corresponding to the row address RA. For example, the activated bank row decoder applies a word-line driving voltage to the word-line corresponding to the row address.

The column address latch 450 may receive the column address COL_ADDR from the address register 420, and may temporarily store the received column address COL_ADDR. In some example embodiments, in a burst mode, the column address latch 450 generates column addresses COL_ADDR' that increment from the received column address COL_ADDR. The column address latch 450 may apply the temporarily stored column address COL_ADDR or generated column address COL_ADDR' to the first through eighth bank column decoders 470a-470h.

The activated one of the first through eighth bank column decoders 470a-470h may activate a sense amplifier corresponding to the bank address BANK_ADDR and the column address COL_ADDR through the I/O gating circuit 490.

The I/O gating circuit 490 may include a circuitry for gating input/output data, and further includes input data mask logic, read data latches for storing data that is output from the first through eighth bank arrays 510a-510h, and write drivers for writing data to the first through eighth bank arrays 510a-510h.

Codeword CW read from one bank array of the first through eighth bank arrays 510a-510h may be sensed by a sense amplifier coupled to the one bank array from which the data is to be read, and may be stored in the read data latches. The codeword CW stored in the read data latches may be provided to the memory controller via the data I/O buffer 495 after ECC decoding is performed on the codeword CW by the ECC engine 590.

The multi-level data MLDAT to be written in one bank array of the first through eighth bank arrays 510a-510h may be provided to the data I/O buffer 495 from the memory controller, may be provided to the ECC engine 590 from the data I/O buffer 495, the ECC engine 590 may perform an ECC encoding on multi-level data MLDAT to generate parity bits, the ECC engine 590 may provide the multi-level data MLDAT and the parity bits to the I/O gating circuit 490 and the I/O gating circuit 490 may write the multi-level data MLDAT and the parity bits in a sub-page in one bank array through the write drivers.

The data I/O buffer 495 may provide the multi-level data MLDAT to the ECC engine 590 in a write operation of the semiconductor memory device 400a, and may provide the multi-level data MLDAT from the ECC engine 590 to the memory controller in a read operation of the semiconductor memory device 400a.

The ECC engine 590 may perform an ECC encoding and an ECC decoding on the multi-level data MLDAT according to a control of the control logic circuit 410.

The control logic circuit 410 may control operations of the semiconductor memory device 400a. For example, the control logic circuit 410 may generate control signals for the semiconductor memory device 400a in order to perform a write operation or a read operation. The control logic circuit 410 may include a command decoder 411 that decodes the command CMD received from the memory controller and a mode register 412 that sets an operation mode of the semiconductor memory device 400a.

For example, the command decoder 411 may generate the control signals corresponding to the command CMD by decoding a write enable signal, a row address strobe signal, a column address strobe signal, a chip select signal, etc.

The ODT circuit 497 may be connected to a data I/O pad 499 and the data I/O buffer 495. When the ODT circuit 497 is enabled, the ODT circuit 497 may perform ODT operation. When the ODT operation is performed, signal integrity of transmitted/received signal may be enhanced by preventing signal reflection due to impedance matching.

Although the semiconductor memory device included in the memory system according to some example embodiments is described based on a DRAM, the semiconductor memory device according to other example embodiments may be any volatile memory device, and/or any nonvolatile memory device, e.g., a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc., but example embodiments are not limited thereto.

Figure 24:
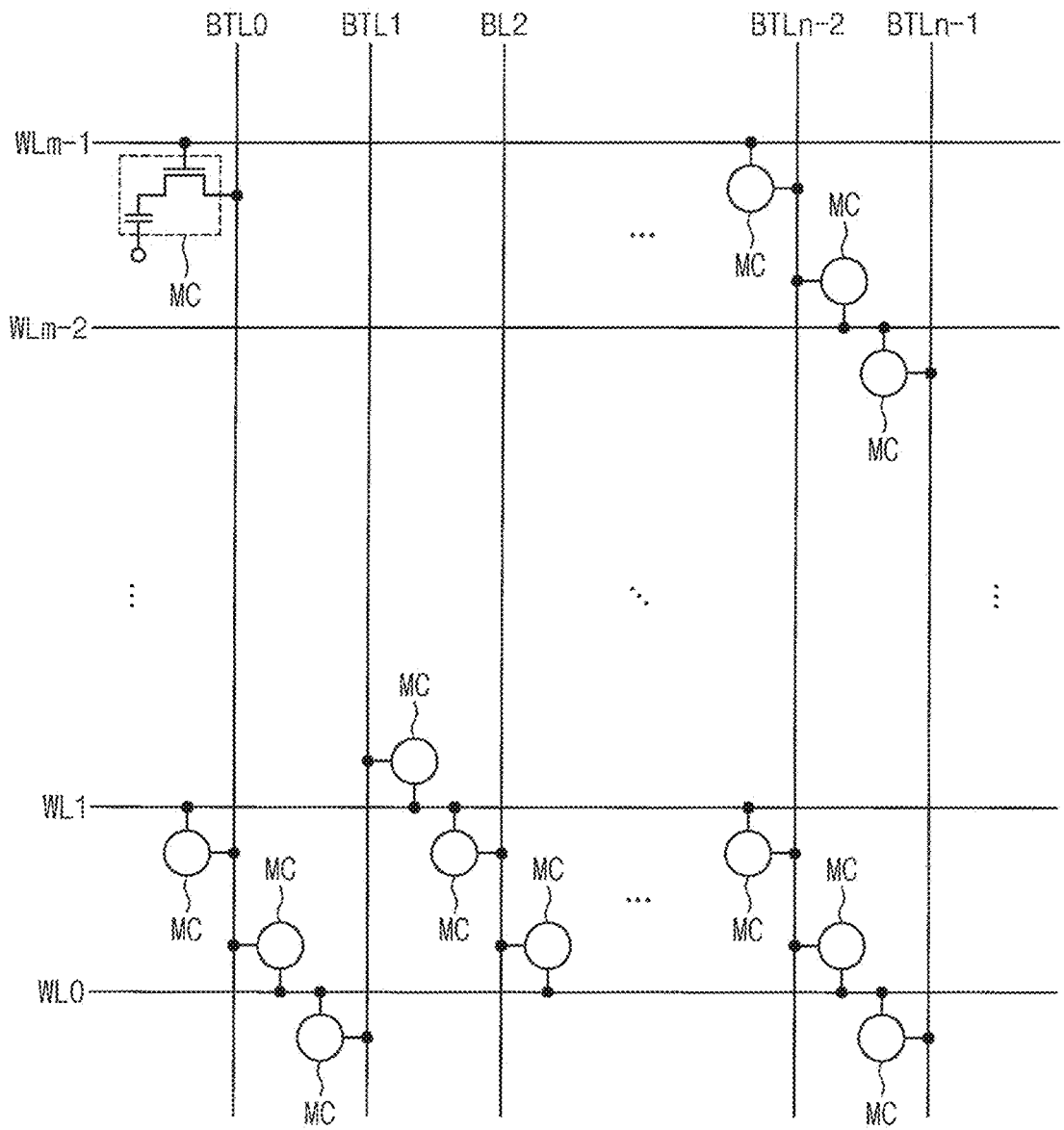
FIG. 24 illustrates an example of the first bank array in the semiconductor memory device of FIG. 23.

FIG. 24 illustrates an example embodiment of the first bank array in the semiconductor memory device of FIG. 23.

Referring to FIG. 24, the first bank array 510a may include a plurality of word-lines WL0-WLm-1 (where m is an even number equal to or greater than two), a plurality of bit-lines BTL0-BTLn-1 (where n is an even number equal to or greater than two), and a plurality of memory cells MCs disposed at intersections between the word-lines WL0-WLm-1 and the bit-lines BTL0-BTLn-1.

The bit-lines BTL0-BTLn-1 may extend in a first direction D1 and the word-lines WL-WLm-1 may extend in a second direction D2 crossing the first direction D1.

Each of the memory cells MCs includes an access (cell) transistor coupled to one of the word-lines WL0-WLm-1 and one of the bit-lines BTL0-BTLn-1 and a storage (cell) capacitor coupled to the cell transistor. That is, each of the memory cells MCs has a DRAM cell structure.

In addition, the memory cells MCs may have different arrangement depending on that the memory cells MCs are coupled to an even word-line (for example, WL0) or an odd word-line (for example, WL1). That is, a bit-line coupled to adjacent memory cells may be different depending on whether a word-line selected by an access address is an even word-line or an odd word-line. However, example embodiments are not limited thereto. The memory cells MCs coupled to the even word-line (for example, WL0) and the odd word-line (for example, WL1) may have the same or substantially the same arrangement.

Figure 25:
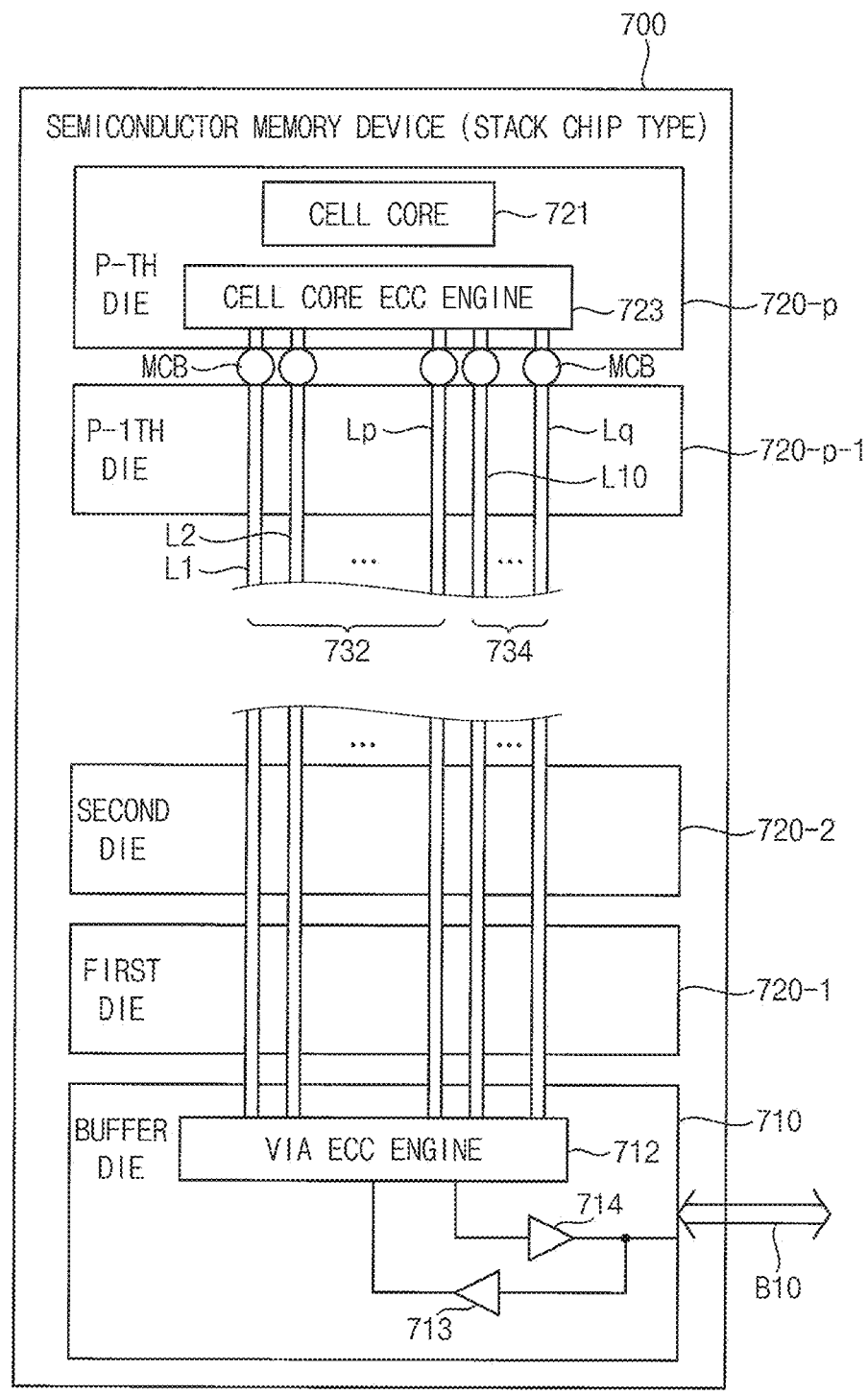
FIG. 25 is a block diagram illustrating a semiconductor memory device according to some example embodiments.

FIG. 25 is a block diagram illustrating a semiconductor memory device according to some example embodiments.

Referring to FIG. 25, a semiconductor memory device 700 may include at least one buffer die 710 and a plurality of memory dies 720-1 to 720-p (p is a natural number equal to or greater than three) providing a soft error analyzing and correcting function in a stacked chip structure.

The plurality of memory dies 720-1 to 720-p are stacked on the buffer die 710 and convey data through a plurality of through silicon via (TSV) lines.

Each of the memory dies 720-1 to 720-p may include a memory core to store data and a cell core ECC engine 722 which generates transmission parity bits (e.g., transmission parity data) based on transmission data to be sent to the at least one buffer die 710. The cell core 721 may include a plurality of memory cells having DRAM cell structure.

The buffer die 710 may include a via ECC engine 712 which corrects a transmission error using the transmission parity bits when a transmission error is detected from the transmission data received through the TSV liens and generates error-corrected data.

The buffer die 710 may further include a receiver 713 and a transmitter 714. The transmitter 714 may employ the transmitter 100 of FIG. 2 and the receiver 713 may employ the receiver 200 of FIG. 12. Therefore, the transmitter 714, instead of encoding the first number of binary input bits provided from the via ECC engine 712 into symbols at one time, divides the first number of binary input into the first bit group including a second number of binary input bits and the second bit group including a third number of binary input bits, generates the first intermediate bit group and the second intermediate bit group by manipulating the first bit group and the second bit group differently according to the value of the first bit group and generates the first symbol group and the second symbol group by encoding the first intermediate bit group and the second intermediate bit group in parallel. Accordingly, the transmitter 714 may reduce an occupied area and power consumption of an encoder included in the transmitter 714. In addition, the receiver 713 may perform an operation on input data signal from the memory controller, which is opposite to the operation of the transmitter 714.

The semiconductor memory device 700 may be a stack chip type memory device or a stacked memory device which conveys data and control signals through the TSV lines. The TSV lines may be also called 'through electrodes'.

The cell core ECC engine 722 may perform error correction on data which is outputted from the memory die 720-p before the transmission data is sent.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

With the above description, a data TSV line group 732 which is formed at one memory die 720-p may include TSV lines L1 and L2 to Lp, and a parity TSV line group 734 may include TSV lines L10 to Lq.

The TSV lines L1 and L2 to Lp of the data TSV line group 732 and the parity TSV lines L10 to Lq of the parity TSV line group 734 may be connected to micro bumps MCB which are correspondingly formed among the memory dies 720-1 to 720-p.

At least one of the memory dies 720-1 to 720-p may include DRAM cells each including at least one access transistor and one storage capacitor.

The semiconductor memory device 700 may have a three-dimensional (3D) chip structure or a 2.5D chip structure to communicate with the host through a data bus B10. The buffer die 710 may be connected with the memory controller through the data bus B10.

The cell core ECC engine 723 may output transmission parity bits as well as the transmission data through the parity TSV line group 734 and the data TSV line group 732 respectively. The outputted transmission data may be data which is error-corrected by the cell core ECC engine 723.

The via ECC engine 712 may determine whether a transmission error occurs at the transmission data received through the data TSV line group 732, based on the transmission parity bits received through the parity TSV line group 734. When a transmission error is detected, the via ECC engine 712 may correct the transmission error on the transmission data using the transmission parity bits. When the transmission error is uncorrectable, the via ECC engine 712 may output information indicating occurrence of an uncorrectable data error.

Figure 26:
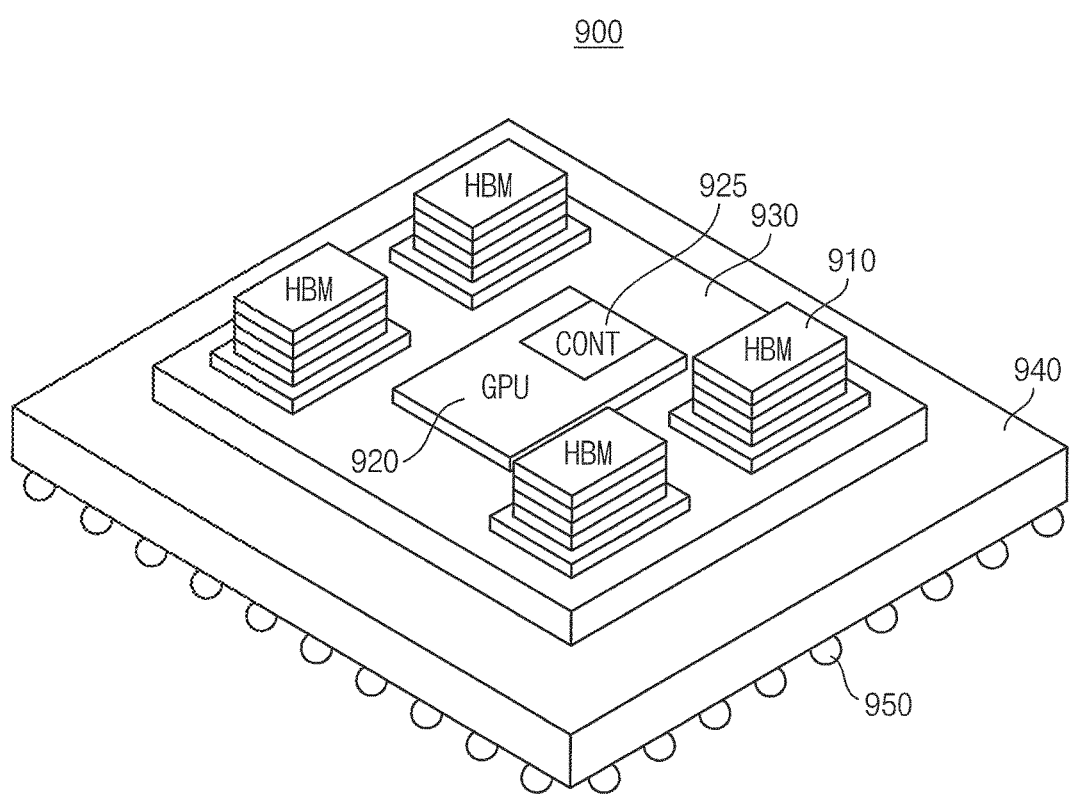
FIG. 26 is a diagram illustrating a semiconductor package including the stacked memory device according to some example embodiments.

FIG. 26 is a diagram illustrating a semiconductor package including the stacked memory device according to some example embodiments.

Referring to FIG. 26, a semiconductor package 900 may include one or more stacked memory devices 910 and a GPU 920, and the GPU 920 includes a memory controller (CONT) 925.

The stacked memory devices 910 and the GPU 920 may be mounted on an interposer 930, and the interposer 930 on which the stacked memory devices 910 and the GPU 920 are mounted may be mounted on a package substrate 940. The package substrate 940 may be mounted on solder balls 950. The memory controller 925 may employ the memory controller in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies, each of the plurality of memory dies may include a cell core, a cell core ECC engine and the buffer die may include a via ECC engine, a transmitter and a receiver.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

The inventive concepts may be applied to various electronic devices and systems that include the memory devices and the memory systems. For example, the inventive concepts may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc., but example embodiments are not limited thereto.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts.

What is claimed is:

1. A transmitter comprising:
an encoder configured to
divide a first number of binary input bits of an input data signal into a first bit group and a second bit group,
generate a first intermediate bit group and a second intermediate bit group by manipulating the first bit group and the second bit group differently based on a value of the first bit group, and
generate a first symbol group by encoding the first intermediate bit group and generate a second symbol group by encoding the second intermediate bit group, each of the first symbol group and the second symbol group including a plurality of symbols, and each of the plurality of symbols having three different voltage levels; and
a driver configured to generate an output data signal by concatenating the first symbol group and the second symbol group, the driver configured to transmit the output data signal through a channel.

2. The transmitter of claim 1, wherein:
the first bit group includes a second number of binary input bits from among the first number of binary input bits;
the second bit group includes a third number of binary input bits from among the first number of binary input bits, and the third number is greater than the second number;
the first intermediate bit group includes the second number of first intermediate bits;
the second intermediate bit group includes a fourth number of second intermediate bits, and the fourth number is greater than the third number by one;
the first symbol group includes a fifth number of first symbols, and the fifth number is smaller than the first number; and
the second symbol group includes a sixth number of second symbols, the sixth number is smaller than the fourth number, and the sixth number is greater than the fifth number.

3. The transmitter of claim 2, wherein the encoder includes:
an intermediate data generator configured to generate the first intermediate bit group and the second intermediate bit group by manipulating the first bit group and the second bit group;
a first sub encoder configured to generate the first symbol group by encoding the first intermediate bit group; and
a second sub encoder configured to generate the second symbol group by encoding the second intermediate bit group.

4. The transmitter of claim 3, wherein the intermediate data generator includes:
a check value generator configured to receive the first bit group, the check value generator configured to generate a check value indicating whether a value of the first bit group is equal to or greater than a first threshold value;
a first data manipulator configured to generate a first sub intermediate bit group by manipulating the first bit group according to a first scheme and generate a second sub intermediate bit group by manipulating the second bit group according to the first scheme, in response to the value of the first bit group being smaller than the first threshold value based on the check value;
a second data manipulator configured to generate a third sub intermediate bit group by manipulating the first bit group according to a second scheme and generate a fourth sub intermediate bit group by manipulating the second bit group according to the second scheme, in response to the value of the first bit group being equal to or greater than the first threshold value based on the check value, wherein the second scheme is different from the first scheme;
a first multiplexer configured to output one of the first sub intermediate bit group and the third sub intermediate bit group as the first intermediate bit group, based on the check value; and
a second multiplexer configured to output one of the second sub intermediate bit group and the fourth sub intermediate bit group as the second intermediate bit group, based on the check value.

5. The transmitter of claim 4, wherein
the second data manipulator is configured to manipulate the first bit group such that a value of the third sub intermediate bit group is smaller than the first threshold value, and the second data manipulator is configured to manipulate the second bit group such that a value of the fourth sub intermediate bit group is smaller than a second threshold value.

6. The transmitter of claim 4, wherein the intermediate data generator further includes:
a first demultiplexer configured to provide the first bit group and the second bit group to the first data manipulator in response to the check value indicating that the value of the first bit group is smaller than the first threshold value, and the first demultiplexer configured to provide the first bit group and the second bit group to the second data manipulator in response to the check value indicating that the value of the first bit group is equal to or greater than the first threshold value; and
a second demultiplexer configured to provide the check value to the first data manipulator in response to the check value indicating that the value of the first bit group is smaller than the first threshold value, and the second demultiplexer configured to provide the check value to the second data manipulator in response to the check value indicating that the value of the first bit group is equal to or greater than the first threshold value.

7. The transmitter of claim 4, wherein, in response to the value of the first bit group being smaller than the first threshold value,
the first data manipulator is configured to provide the first bit group as the first sub intermediate bit group, and the first data manipulator is configured to provide the check value and the second bit group as the second sub intermediate bit group.

8. The transmitter of claim 4, wherein, in response to the value of the first bit group being equal to or greater than the first threshold value,
the second data manipulator is configured to provide a manipulated portion of first binary input bits of the first bit group and a portion of second binary input bits of the second bit group as the third sub intermediate bit group, and the second data manipulator is configured to provide the check value, a specific constant and a remaining portion of the second binary input bits of the second bit group as the fourth sub intermediate bit group.

9. The transmitter of claim 3, wherein:
the first sub encoder is configured to generate the first symbol group including three first symbols by performing a first encoding on the first intermediate bit group including first intermediate bits corresponding to five-bit; and
the second sub encoder is configured to generate the second symbol group including five second symbols by performing a second encoding on the second intermediate bit group including second intermediate bits corresponding to seven-bit.

10. The transmitter of claim 9, wherein the first sub encoder is configured to perform the first encoding in parallel with the second sub encoder performing the first encoding.

11. The transmitter of claim 9, wherein:
the first sub encoder is configured to perform the first encoding using a first look-up table indicating a mapping relation between the first intermediate bits and the first symbols; and
the second sub encoder is configured to perform the second encoding using a second look-up table indicating a mapping relation between the second intermediate bits and the second symbols.

12. A receiver comprising:
a decoder configured to
generate a first intermediate bit group by decoding a first symbol group of an input data signal, and generate a second intermediate bit group by decoding a second symbol group of the input data signal, each of the first symbol group and the second symbol group including a plurality of symbols, and each of the plurality of symbols having three different voltage levels, and generate a first bit group and a second bit group by manipulating the first intermediate bit group and the second intermediate bit group differently based on a value of a specific bit of the second intermediate bit group; and
a buffer configured to generate an output data signal including a first number of binary output bits by buffering the first bit group and the second bit group.

13. The receiver of claim 12, wherein:
the first bit group includes a second number of binary output bits from among the first number of binary output bits;
the second bit group includes a third number of binary output bits from among the first number of binary output bits, and the third number is greater than the second number;
the first intermediate bit group includes the second number of first intermediate bits;
the second intermediate bit group includes a fourth number of second intermediate bits, and the fourth number is greater than the third number by one;
the first symbol group includes a fifth number of first symbols, and the fifth number is smaller than the first number; and
the second symbol group includes a sixth number of second symbols, the sixth number is smaller than the fourth number, and the sixth number is greater than the fifth number.

14. The receiver of claim 13, wherein the decoder includes:
a first sub decoder configured to generate the first intermediate bit group by decoding the first symbol group;
a second sub decoder configured to generate the second intermediate bit group by decoding the second symbol group; and
a data recovery circuit configured to recover the first bit group and the second bit group by manipulating the first intermediate bit group and the second intermediate bit group differently based on a value of the specific bit of the second intermediate bit group.

15. The receiver of claim 14, wherein the data recovery circuit includes:
a check value extractor configured to output a check value by extracting the specific bit from the second intermediate bit group;
a first data recovering logic configured to generate a first sub bit group by manipulating the first intermediate bit group according to a first scheme and generate a second sub bit group by manipulating the second intermediate bit group according to the first scheme, in response to the check value having a first logic level;
a second data recovering logic configured to generate a third sub bit group by manipulating the first intermediate bit group according to a second scheme and generate a fourth sub bit group by manipulating the second intermediate bit group according to the second scheme, in response to the check value having a second logic level different from the first logic level, wherein the second scheme is different from the first scheme;

a first multiplexer configured to output one of the first sub bit group and the third sub bit group as the first bit group, based on the check value; and a second multiplexer configured to output one of the second sub bit group and the fourth sub bit group as the second bit group, based on the check value.

16. The receiver of claim 15, wherein the data recovery circuit further includes a multiplexer configured to:

provide the first intermediate bit group and the second intermediate bit group to the first data recovering logic, in response to the check value having the first logic level; and provide the first intermediate bit group and the second intermediate bit group to the second data recovering logic, in response to the check value having the second logic level.

17. The receiver of claim 15, wherein, in response to the check value having the first logic level, the first data recovering logic is configured to:

provide the first intermediate bit group as the first sub bit group; and provide the second sub bit group by eliminating the specific bit from the second intermediate bit group.

18. The receiver of claim 15, wherein, in response to the check value having the second logic level, the second data recovering logic is configured to:

provide the third sub bit group by filling the specific bit with a specific constant and manipulating a portion of first intermediate bits of the first intermediate bit group; and provide a remaining portion of the first intermediate bits of the first intermediate bit group and a portion of second intermediate bits of the second intermediate bit groups as the fourth sub bit group.

19. A system comprising:

a transmitter including an encoder and a driver, the transmitter configured to output a write data to be stored in a semiconductor memory device;

a channel configured to transmit the write data; and a receiver including a decoder and a buffer, the receiver configured to receive the write data, wherein the encoder is configured to divide a first number of binary input bits of an input data signal into a first bit group and a second bit group, generate a first intermediate bit group and a second intermediate bit group by manipulating the first bit group and the second bit group differently based on a value of the first bit group, and generate a first symbol group by encoding the first intermediate bit group and generate a second symbol group by encoding the second intermediate bit group, each of the first symbol group and the second symbol group including a plurality of symbols, and each of the plurality of symbols having three different voltage levels, and the driver is configured to generate an output data signal by concatenating the first symbol group and the second symbol group and configured to transmit the output data signal through the channel; and wherein the decoder is configured to receive the output data signal including the first symbol group and the second symbol group, generate the first intermediate bit group by decoding the first symbol group and generate the second intermediate bit group by decoding the second symbol group, and generate the first bit group and the second bit group by manipulating the first intermediate bit group and the second intermediate bit group differently based on a value of a specific bit of the second intermediate bit group, and the buffer is configured to generate an output data signal including the first number of binary output bits by buffering the first bit group and the second bit group.

20. The system of claim 19, wherein:

the input data signal, the output data signal and output data correspond to the write data;

the transmitter is included in a graphic processing unit (GPU) configured to generate the write data; and the semiconductor memory device includes a graphic double data rate 7 (GDDR7) synchronous dynamic random access memory (SDRAM) device.

* * * * *